(12) United States Patent
Khater

(10) Patent No.: US 7,341,920 B2
(45) Date of Patent: Mar. 11, 2008

(54) METHOD FOR FORMING A BIPOLAR TRANSISTOR DEVICE WITH SELF-ALIGNED RAISED EXTRINSIC BASE

(75) Inventor: Marwan H. Khater, Long Island City, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 11/160,706

(22) Filed: Jul. 6, 2005

(65) Prior Publication Data

US 2007/0007625 A1    Jan. 11, 2007

(51) Int. Cl.
*H01L 21/331*   (2006.01)
*H01L 21/8222*  (2006.01)
*H01L 27/082*   (2006.01)

(52) U.S. Cl. ............... 438/364; 257/565; 257/E21.205; 257/E21.507; 438/309

(58) Field of Classification Search ................ 438/364, 438/309, 182; 257/E21.507, E21.205
See application file for complete search history.

(56) References Cited

U.S. PATENT DOCUMENTS

| | | | |
|---|---|---|---|
| 5,128,271 A | 7/1992 | Bronner et al. | |
| 5,494,836 A | 2/1996 | Imai | |
| 5,506,427 A | 4/1996 | Imai | |
| 5,593,905 A * | 1/1997 | Johnson et al. | 438/365 |
| 5,962,880 A | 10/1999 | Oda et al. | |
| 6,297,162 B1 * | 10/2001 | Jang et al. | 438/706 |
| 6,346,453 B1 | 2/2002 | Kovacic et al. | |
| 2003/0096486 A1 * | 5/2003 | Chuang et al. | 438/309 |
| 2004/0150004 A1 * | 8/2004 | Aoki et al. | 257/197 |

OTHER PUBLICATIONS

Jagannathan, et al., :Self-aligned SiGe NPN transistors with 285GHz fmax and 207 GHzfT in a manufacturable technology, IEEE Electron Device Letters 23,258 (2002).

J.S. Rieh, et. al., "SiGe HBTs with cut-off frequency of 350 GHz", International Electron Device Meeting Technical Digest, 771 (2002).

* cited by examiner

*Primary Examiner*—Carl Whitehead, Jr.
*Assistant Examiner*—Daniel M Luke
(74) *Attorney, Agent, or Firm*—Gibb & Rahman, LLC

(57) ABSTRACT

Disclosed are embodiments of a method of fabricating a bipolar transistor with a self-aligned raised extrinsic base. In the method a dielectric pad is formed on a substrate with a minimum dimension capable of being produced using current state-of-the-art lithographic patterning. An opening is aligned above the dielectric pad and etched through an isolation oxide layer to an extrinsic base layer. The opening is equal to or greater in size than the dielectric pad. Another smaller opening is etched through the extrinsic base layer to the dielectric pad. A multi-step etching process is used to selectively remove the extrinsic base layer from the surfaces of the dielectric pad and then to selectively remove the dielectric pad. An emitter is then formed in the resulting trench. The resulting transistor structure has a distance between the edge of the lower section of the emitter and the edge of the extrinsic base that is minimized, thereby, reducing resistance.

24 Claims, 22 Drawing Sheets

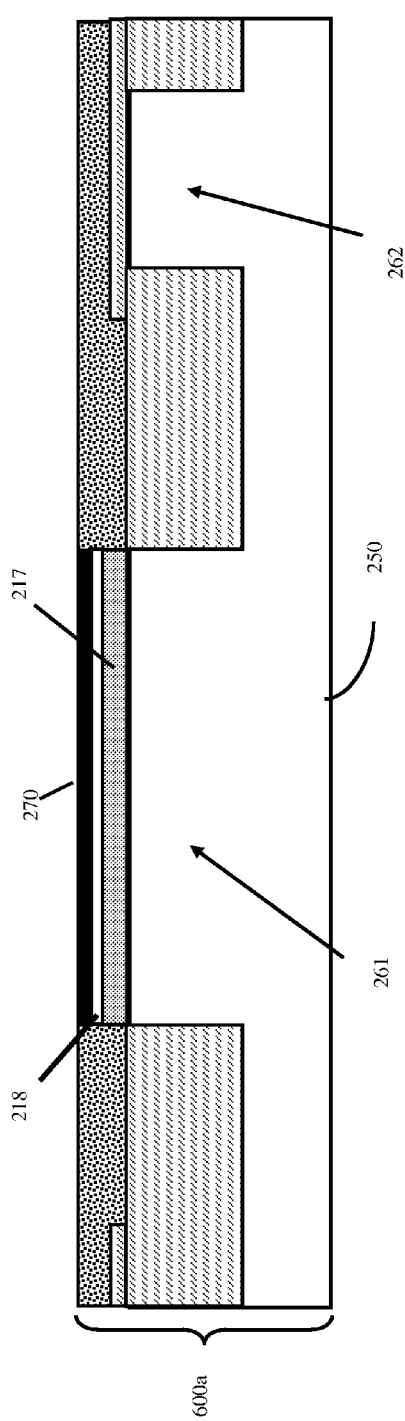
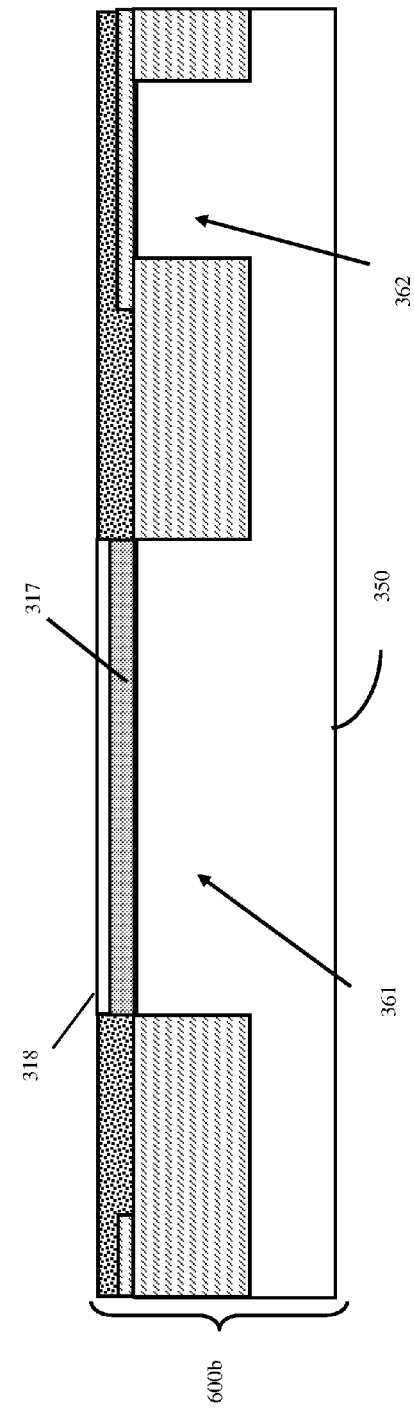
Figure 6a
Figure 6b

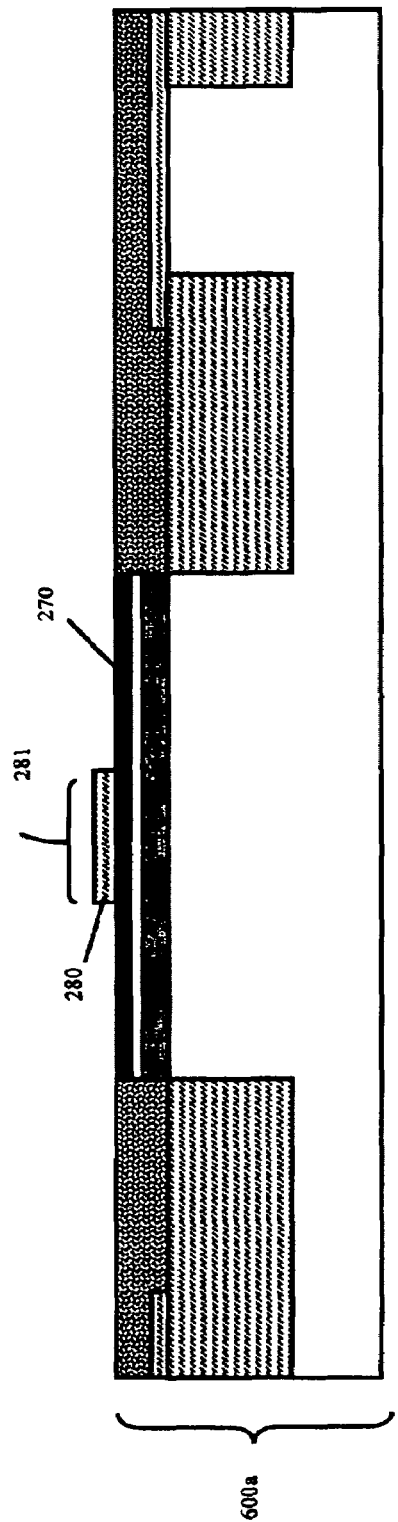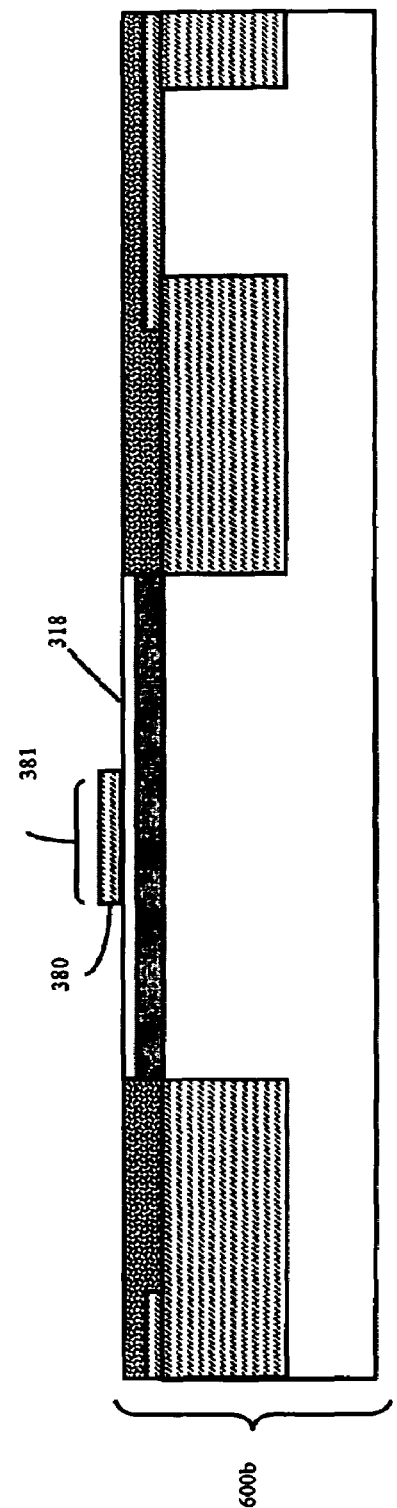

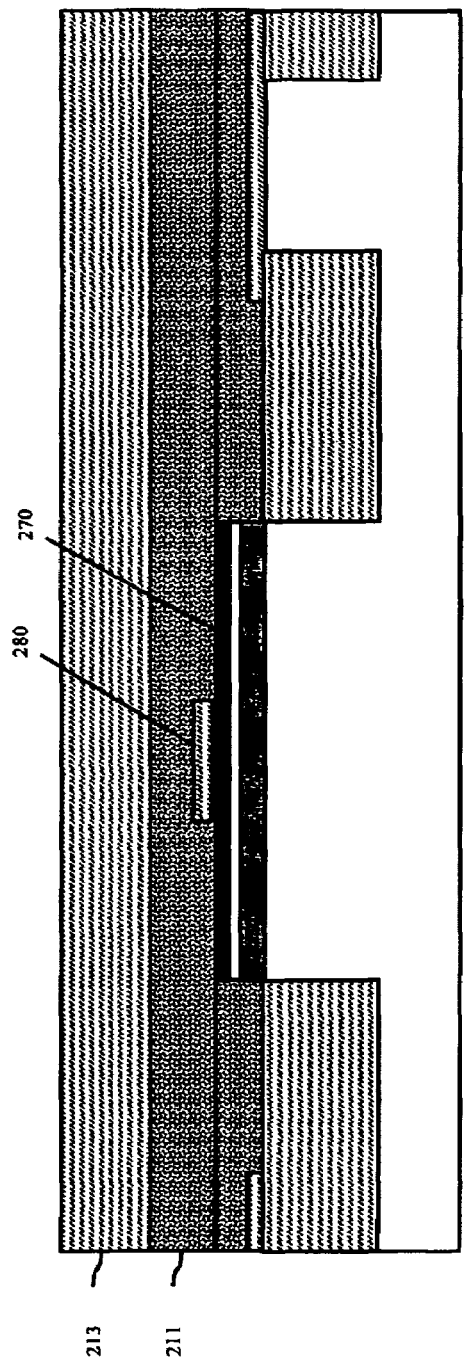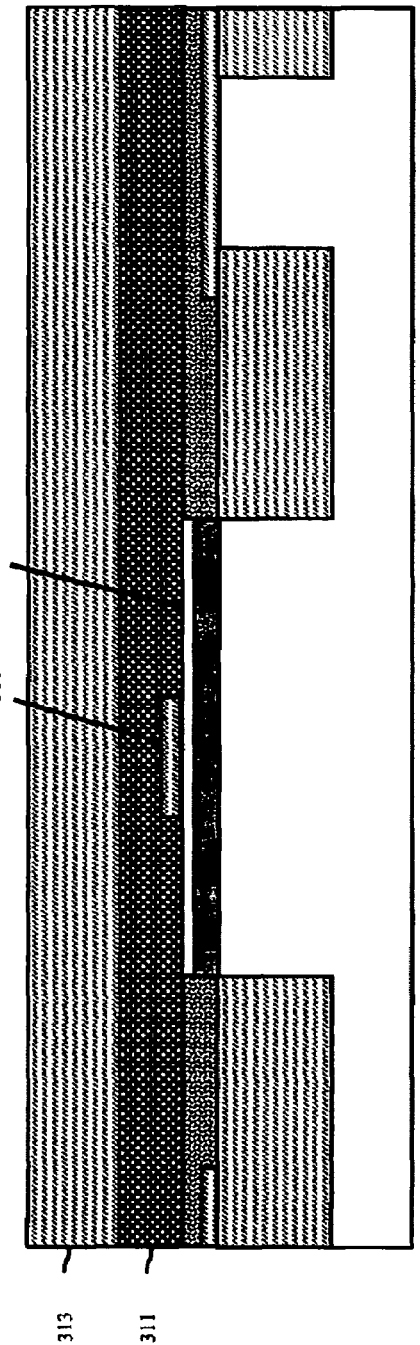

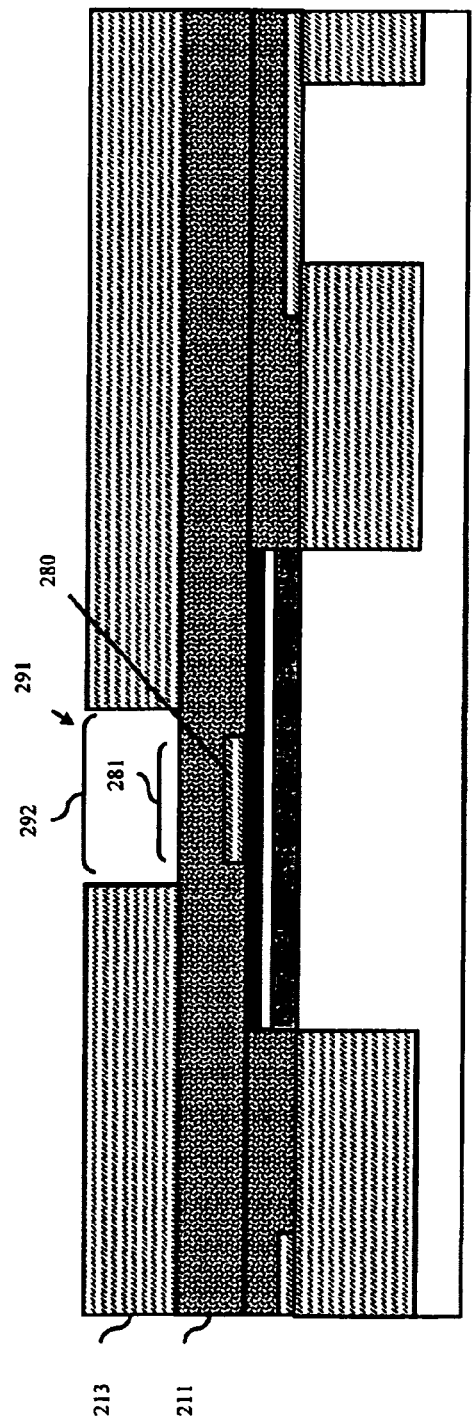
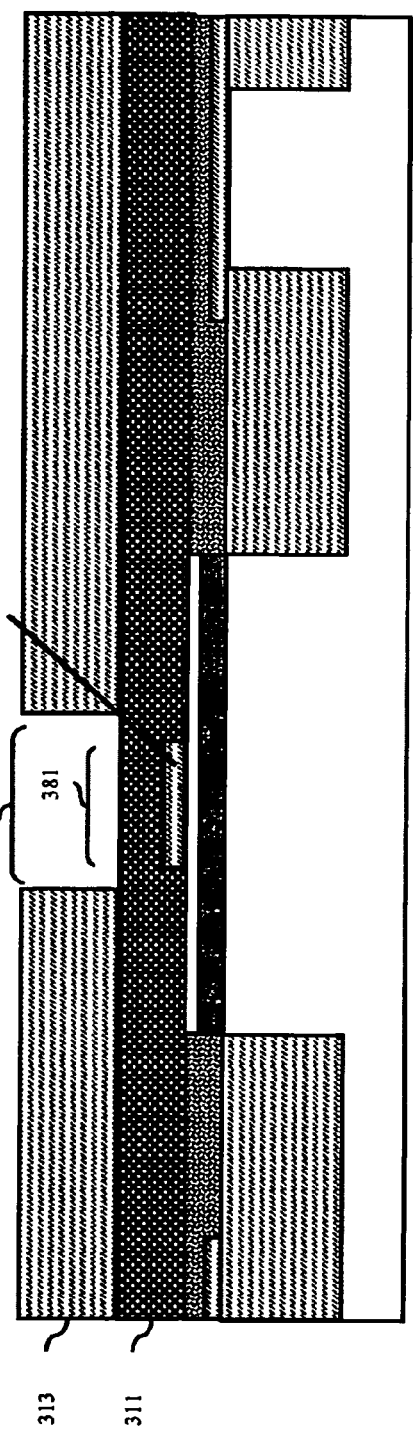
Figure 9a
Figure 9b

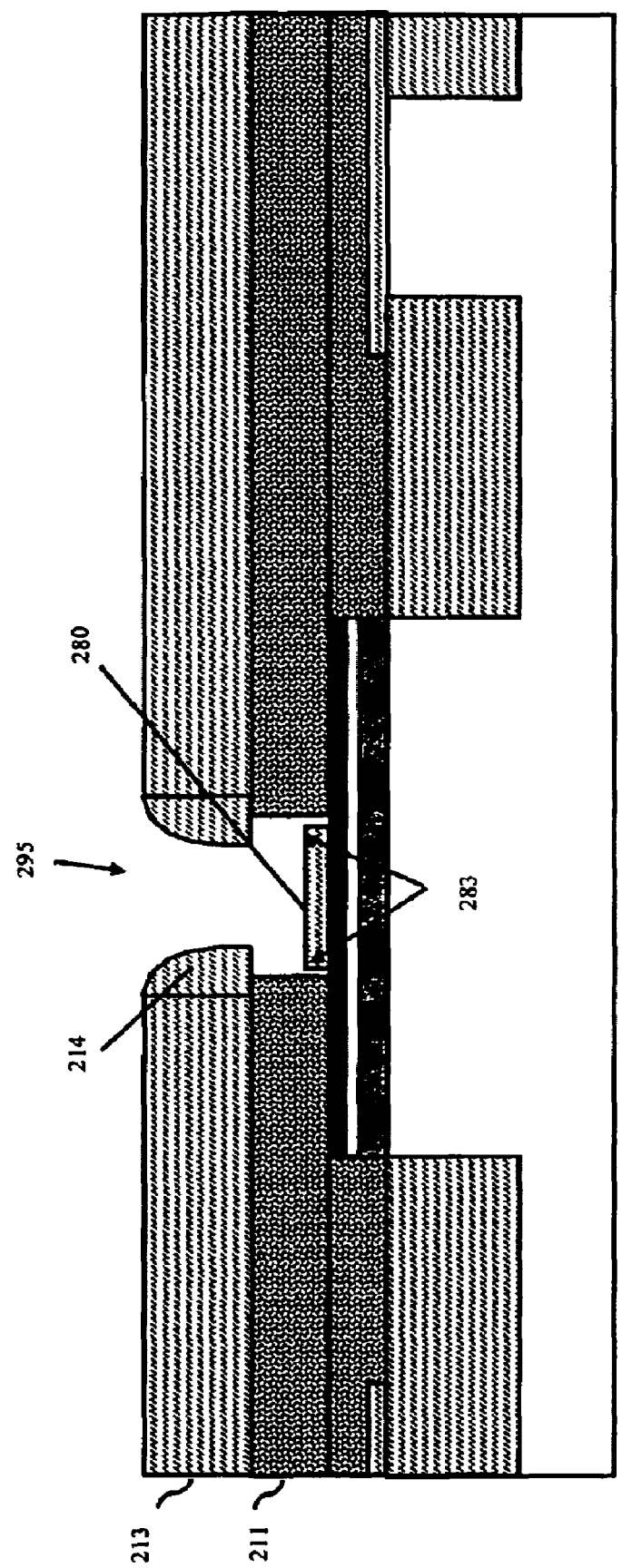

METHOD FOR FORMING A BIPOLAR TRANSISTOR DEVICE WITH SELF-ALIGNED RAISED EXTRINSIC BASE

BACKGROUND OF THE INVENTION

1. Field of the Invention

The invention relates to bipolar transistors and, more particularly, to a method of forming a bipolar transistor with a self-aligned raised extrinsic base.

2. Description of the Related Art

Both non-self aligned and self-aligned bipolar transistors having a silicon (Si) or silicon-germanium (SiGe) intrinsic base and a doped polycrystalline silicon raised extrinsic base are the focus of integrated circuits fabricated for high performance mixed signal applications. Referring to FIG. 1, a non-self aligned bipolar transistor 10 with a polysilicon raised extrinsic base 11 can be formed by forming an emitter opening using a reactive ion etching (RIE) process through an oxide 13/polysilicon base layer 11 and stopping on a dielectric etch stop pad 14 (e.g., an oxide pad). The dielectric etch stop pad 14 is formed and defined with a lithography step prior to the deposition of the oxide 13/polysilicon 11 stack. However, this method results in a non-self aligned transistor structure 10 with limited performance. Specifically, the maximum oscillation frequency ($f_{max}$) for such a non-self aligned bipolar transistor structure 10 is low due to high base resistance ($R_b$). High $R_b$ is caused by the large, non-self aligned, spacing 16 between the edge of the emitter 15 and the edge of the extrinsic base 11, which increases the current path and thus, the resistance between the emitter and the extrinsic base and which also significantly limits the electrical contact area 26 available between the intrinsic base 17 and the extrinsic base 11. As illustrated in FIG. 1, this spacing 16 is determined by the dielectric etch stop pad 14 dimension, which needs to be larger than the dimension of the emitter 15 opening due lithography alignment tolerance. As can also be seen from FIG. 1, such limited lithography tolerance leads to non-symmetric portions of the dielectric etch stop pad 14 around the emitter 15.

The maximum oscillation frequency of modern bipolar transistors has been increased by using a self-aligned structure that reduces the spacing between the emitter and the extrinsic base edges. A bipolar transistor with a self-aligned base incorporates the use of spacers in order to symmetrically place the emitter and extrinsic base edges within close proximity (e.g., see Jagannathan, et. al., "Self-aligned SiGe NPN transistors with 285 GHz $f_{max}$ and 207 GHz $f_T$ in a manufacturable technology", IEEE Electron Device Letters 23, 258 (2002) and J. S. Rieh, et. al., "SiGe HBTs with cut-off frequency of 350 GHz", International Electron Device Meeting Technical Digest, 771 (2002)). In one method chemical mechanical polishing (CMP) is used to planarize the extrinsic base polysilicon over a pre-defined sacrificial emitter pedestal (e.g., see U.S. Pat. No. 5,128,271, Bronner et al., Jul. 7, 1992 (incorporated herein by reference), U.S. Pat. No. 6,346,453, Kovacic et al., Feb. 12, 2002 (incorporated herein by reference) and U.S Patent Application Pub. No. US2003/0057458 A1, Freeman et al., Mar. 27, 2003 (incorporated herein by reference)). An extrinsic base region formed in this manner has an area A and depth D with a low aspect ratio (D/A<<1). This low aspect ratio can lead to a significant difference in the extrinsic base layer thickness between small and large, as well as isolated versus nested, devices due to dishing caused by the CMP. In another method the intrinsic base is grown using selective epitaxy inside an emitter opening and an undercut formed under the extrinsic base polysilicon layer (e.g., see U.S. Pat. No. 5,494,836, Imai, Feb. 27, 1996 (incorporated herein by reference), U.S. Pat. No. 5,506,427, Imai, Apr. 9, 1996 (incorporated herein by reference) and U.S. Pat. No. 5,962,880, Oda et al., Oct. 5, 1999 (incorporated herein by reference). Self-alignment of the extrinsic base is achieved with the epitaxial growth inside the undercut and special techniques are required to ensure a good link-up contact between the intrinsic base and the extrinsic base. See also U.S. Pat. No. 6,869,852, Joseph et al., Mar. 22, 2005 (incorporated herein by reference) and U.S. Patent Pub. No. US 2005/0048735, Khater et al., Mar. 3, 2005 (incorporated herein by reference), which also describe methods of forming a transistor with a self-aligned raised extrinsic base. Although there are known methods of fabricating a transistor with a self-aligned raised extrinsic base to reduce base resistance, these known methods often have process and manufacturing complexities. Thus, there is a need in the art for a simple fabrication method to manufacture a bipolar transistor with a self-aligned raised extrinsic base.

SUMMARY OF THE INVENTION

Disclosed are fabrication methods for a bipolar transistor with a self-aligned raised extrinsic base that use a simple process flow, similar to that of a bipolar transistor with non-self aligned raised extrinsic base, and resulting transistor structures formed according to these methods. Generally, one exemplary method comprises forming shallow trench isolation structures in a crystalline silicon layer to define a collector region and a collector reach-through region in the crystalline silicon layer. Then, an intrinsic base layer can be formed (e.g., with either a crystalline silicon or crystalline silicon germanium material) on the collector region of the crystalline silicon layer. An emitter cap layer (e.g., another crystalline silicon layer) can be formed on the intrinsic base layer. In one embodiment a crystalline silicon germanium layer is then formed on the emitter cap layer and a dielectric etch stop pad (e.g., an oxide pad) is formed on the silicon germanium layer. In another embodiment the dielectric etch stop pad (e.g., the oxide pad) is formed directly on the emitter cap layer. In either embodiment the dielectric etch stop pad is formed with a predetermined first area dimension (e.g., a minimum dimension capable of being produced using current state-of-the-are lithographic patterning). Once the dielectric etch stop pad is formed, an extrinsic base layer is formed (e.g., deposited) over dielectric etch stop pad and onto the substrate. Specifically, in the embodiment in which the dielectric etch stop pad is formed on a crystalline silicon germanium layer above the emitter cap layer, the extrinsic base layer is formed with a polycrystalline silicon material on the dielectric etch stop pad and the crystalline silicon germanium layer. In the embodiment in which the dielectric etch stop pad is formed directly on the emitter cap layer, the extrinsic base layer is formed with a polycrystalline silicon germanium material on the dielectric etch stop pad and the emitter cap layer. Then, a dielectric layer (e.g., an oxide layer) is formed over the extrinsic base layer.

Once the dielectric layer is formed, a first opening is etched through the dielectric layer to the extrinsic base layer. The first opening is aligned (i.e., approximately centered) over the dielectric etch stop pad and has a second area dimension that is approximately equal to or greater than the first area dimension (i.e., the first opening is greater in size than the dielectric etch stop pad). A second opening is then defined and etched through the extrinsic base layer stopping on the dielectric etch stop pad. The second opening has a third area dimension that is less than the first area dimension (i.e., the second opening is smaller in size than the dielectric etch stop pad and does not overlap the edges of the dielectric etch stop pad). Spacers formed in the first opening on the extrinsic base layer adjacent the dielectric layer can be used to align the second opening and to make sure the second opening has the desired dimension.

An emitter is formed in the trench that is created by the first opening and the second opening. The emitter can be formed by first removing the dielectric etch stop pad within the trench. Specifically, in order to remove the dielectric etch stop pad the extrinsic base layer is etched selective to the underlying layer (i.e., selective to either the crystalline silicon germanium layer or the crystalline silicon emitter cap layer, depending upon the embodiment) such that the extrinsic base layer is removed from all surfaces of the dielectric etch stop pad. Removing the extrinsic base layer from all surfaces of the dielectric etch stop pad, allows the dielectric etch stop pad to be selectively etched and completely removed off the substrate. Once the dielectric etch stop pad is removed, a conformal oxide layer (e.g., a passivation oxide) can be formed on a bottom surface (i.e., on the emitter cap layer at the bottom of the trench) and on sidewalls of the trench as well as over the dielectric layer. In one embodiment, the crystalline silicon germanium layer may be removed selective to the emitter silicon cap layer prior to depositing the conformal oxide layer. Spacers (e.g., nitride spacers) can then be formed on the conformal oxide layer such that a portion of the conformal oxide layer on the bottom surface of the trench remains exposed, thus, defining the size of a lower (vertically oriented) section of the emitter. Once the spacers are formed, the exposed portion of the conformal oxide layer is etched to expose the emitter cap layer. This process will simultaneously remove the conformal oxide layer from the top surface of the dielectric layer. A semiconductor material (e.g., polycrystalline silicon) is deposited into the trench and over the dielectric layer thus forming a lower (horizontally oriented) section of the emitter. A second dielectric layer (e.g., a nitride layer) can be formed on the semiconductor material. Then, an upper (horizontally oriented) section of the emitter can be defined by a lithographic patterning and etching process. Once the upper section of the emitter is defined, additional fabrication process steps can be performed to complete the transistor (e.g., defining the outer limits of the raised extrinsic base, forming silicides, forming contacts, etc.).

An embodiment of the bipolar transistor formed as a result of the above described method comprises an extrinsic base layer and an emitter cap layer below the extrinsic base layer. The transistor further comprises an emitter that has a lower, vertically oriented, section and an upper, horizontally oriented, section. The lower section can extend through the extrinsic base layer such that its bottom surface contacts the emitter cap layer. Additionally, the transistor comprises an L-shaped dielectric layer (e.g., an oxide layer) that separates the lower section of the emitter from the extrinsic base layer. The L-shaped dielectric layer has a horizontal portion and a vertical portion. A bottom surface of the horizontal portion is positioned adjacent the emitter cap layer and an outer end is positioned immediately adjacent to the emitter. The vertical portion can extend from the emitter cap layer to the upper section of the emitter. The extrinsic base layer has a continuous edge that extends upwards from the emitter cap layer and is positioned immediately adjacent the vertical portion of the L-shaped dielectric layer so that the edge of the extrinsic base layer is oriented approximately parallel to the lower section of the emitter. So configured, the distance between the edge of the lower section of the emitter and the edge of the extrinsic base does not vary and is minimized. Additionally, the surface area providing electrical contact between the intrinsic and extrinsic base layers is maximized. The transistor can further comprise spacers (e.g., nitride spacers) above the horizontal portion of the L-shaped dielectric layer between the vertical portion and the emitter. These spacers define the shape of the lower section of the emitter.

The emitter cap layer of the transistor can comprise a crystalline semiconductor material (e.g., silicon) as can the substrate on which the transistor is formed. The intrinsic base layer can also comprise a crystalline semiconductor material (e.g., crystalline silicon or silicon germanium). The extrinsic base layer can comprise a polycrystalline semiconductor material (e.g., polycrystalline silicon or a polycrystalline silicon germanium material). A crystalline silicon germanium layer can be positioned between the emitter cap layer and the extrinsic base layer. This silicon germanium layer can act as an etch stop layer during the transistor fabrication process (e.g., if the extrinsic base layer is a polycrystalline silicon) and can also be adapted to reduce base resistance (i.e., resistivity between the intrinsic and extrinsic base layers). For example, the crystalline silicon germanium layer can have a predetermined thickness and a determined germanium content in order to apply an optimal level of stress to the emitter cap layer and the intrinsic base layer. This stress will increase the carriers (e.g. electrons or holes) mobility and enhances conductivity between the intrinsic base layer and the extrinsic base layer. Similarly, if the extrinsic base layer is polycrystalline silicon germanium material, the germanium content in the extrinsic base layer can be predetermined to apply an optimal level of stress to the emitter cap layer and the intrinsic base layer.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIGS. 6a-b are schematic diagrams of partially completed transistors of FIGS. 2 and 3, respectively;

FIGS. 7a-b are schematic diagrams of partially completed transistors of FIGS. 2 and 3, respectively;

FIGS. 8a-b are schematic diagrams of partially completed transistors of FIGS. 2 and 3, respectively;

FIGS. 9a-b are schematic diagrams of partially completed transistors of FIGS. 2 and 3, respectively;

FIGS. 12a-b are schematic diagrams of partially completed transistors of FIGS. 2 and 3, respectively;

DETAILED DESCRIPTION OF PREFERRED EMBODIMENTS OF THE INVENTION

Figure 1:
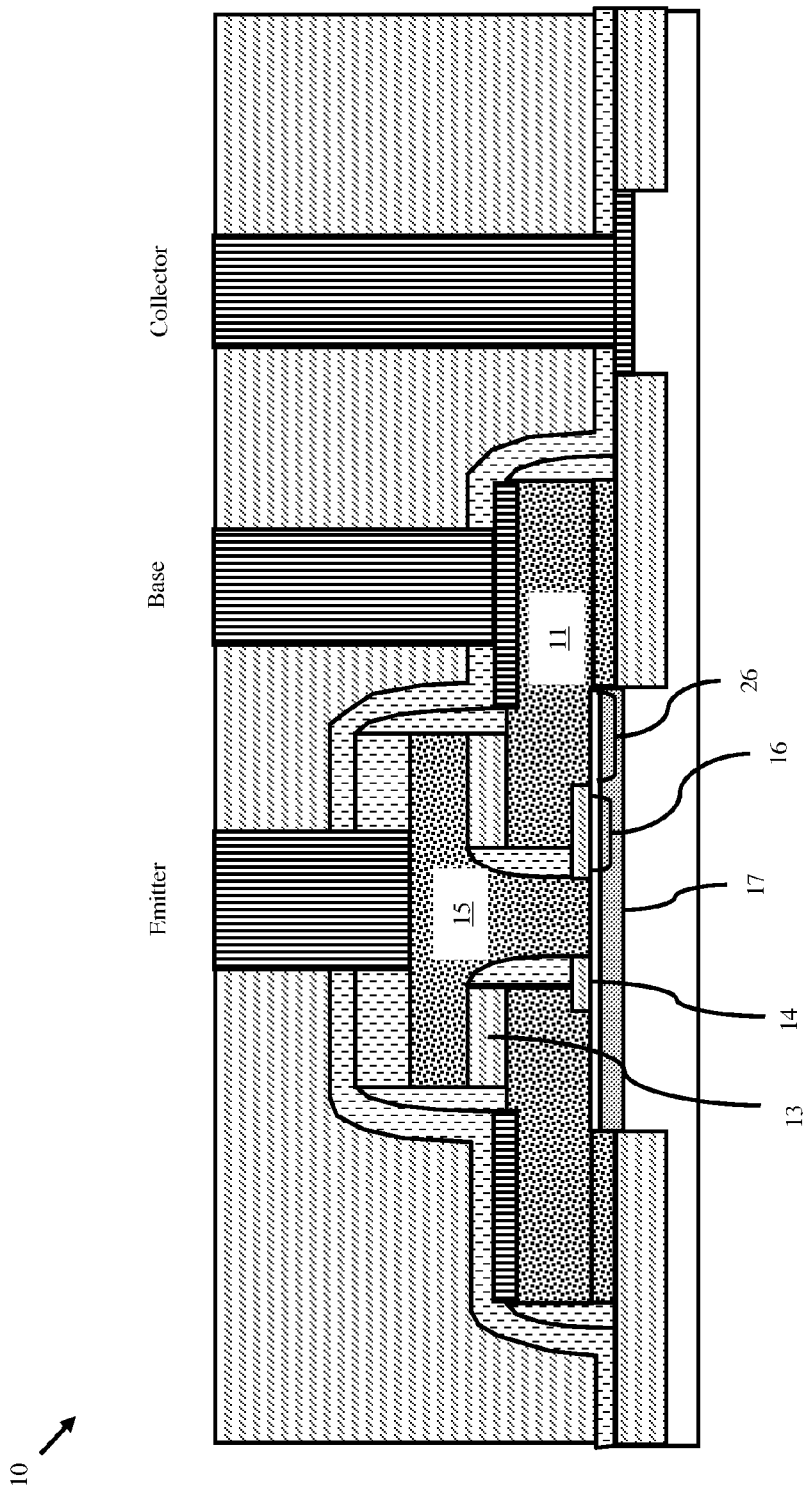
FIG. 1 is a schematic diagram of a non-self aligned bipolar transistor with a raised extrinsic base according to the prior art.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Referring to FIG. 1, as discussed above, prior art bipolar transistors 10 with non-self-aligned raised extrinsic base 11 suffer from low maximum oscillation frequency ($f_{max}$) due to high base resistance ($R_b$) caused by an increased space 16, caused and limited by the dielectric etch stop pad lithographic dimension, and thus an increased current path between the edges of the emitter 15 and extrinsic 11 base. Additionally, prior art self-aligned transistors have various process and manufacturing complexities and could benefit from structural improvements that further reduce base resistance. Therefore, there is a need in the art for a simple fabrication method for such a self-aligned bipolar transistor that is similar to the simple methods used to fabricate a non-self aligned transistor as well as an improved bipolar transistor with a self-aligned raised extrinsic base that exhibits less base resistance.

Figure 2:
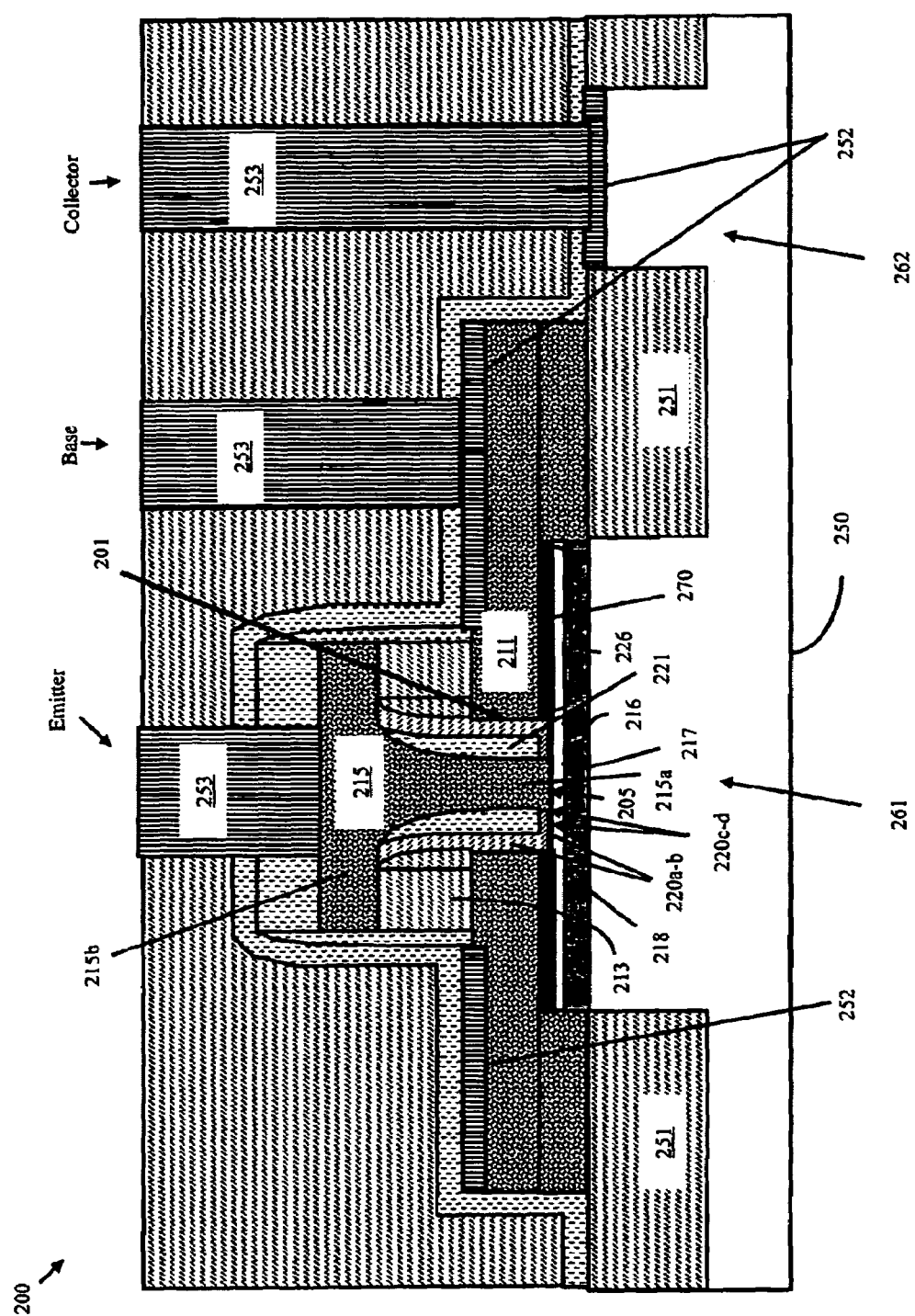
FIG. 2 is a schematic diagram of an embodiment of a self-aligned bipolar transistor with a raised extrinsic base according to a method of the invention.
Figure 3:
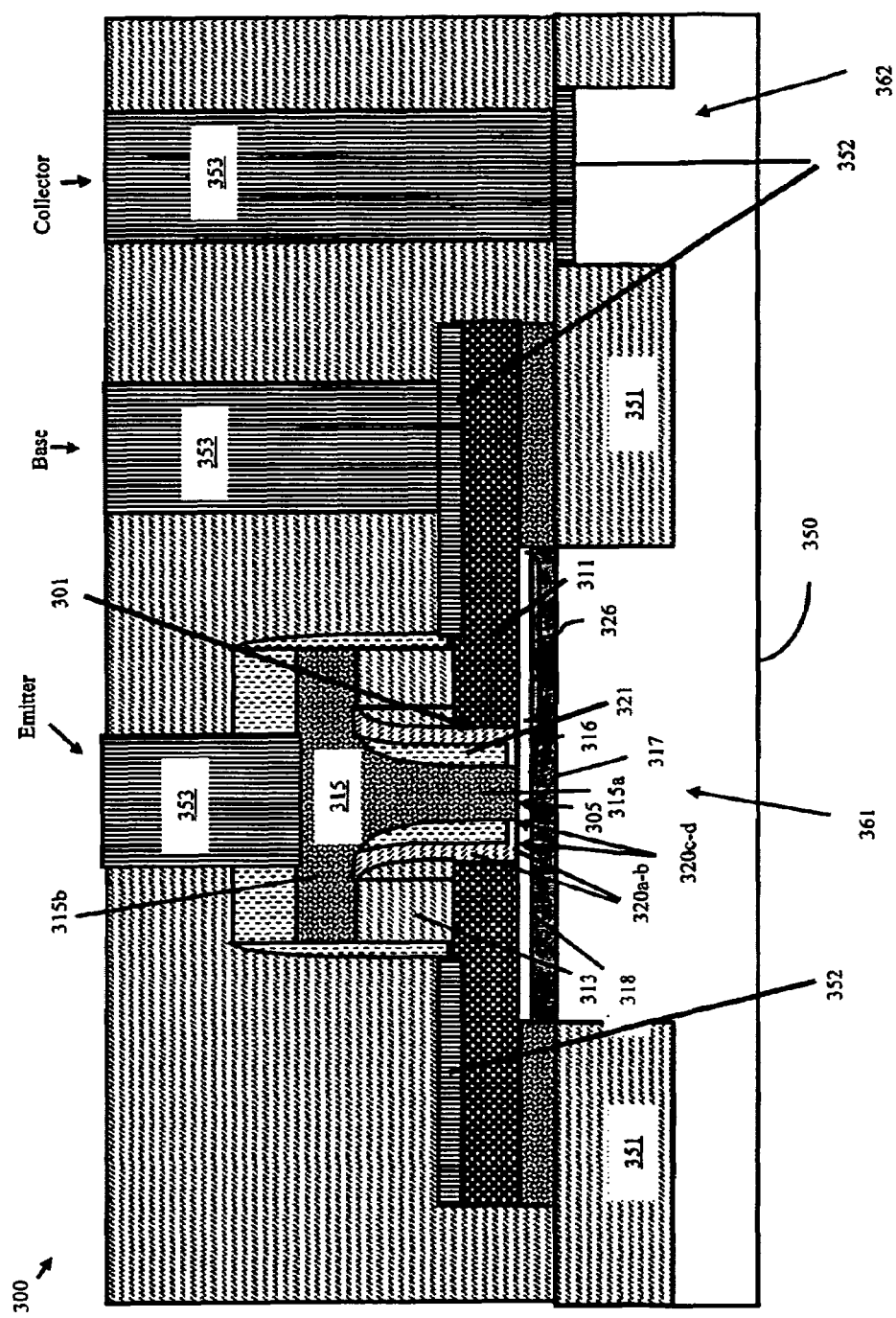
FIG. 3 is a schematic diagram of another embodiment of a self-aligned bipolar transistor with a raised extrinsic base according to a method of the invention.

Disclosed herein are embodiments of a method of fabricating a bipolar transistor structure with a self-aligned raised extrinsic base as well as embodiments of the improved bipolar transistor structures that result from this method. FIGS. 2 and 3 illustrate the bipolar transistors 200, 300 that are formed according to embodiments of the method of the invention. The transistors 200, 300 are formed on a semiconductor layer 250, 350 of a wafer (e.g., crystalline silicon layer). Shallow trench isolation structures 251, 351 define and separate a collector region 261, 361 and a collector reach-through region 262, 263. An intrinsic base layer 217, 317 (e.g., crystalline silicon or crystalline silicon germanium) is located above the collector region 261, 361. An emitter cap layer 218, 318 is above the intrinsic base layer 217, 317. The transistor 200, 300 can further comprise an emitter 215, 315 that has a lower, vertically oriented, section 215a, 315a and an upper, horizontally oriented, section 215b, 315b. The lower section 215a, 315a can extend through the extrinsic base layer 211, 311 such that its bottom surface 205, 305 contacts the emitter cap layer 218, 318.

The transistor 200, 300 can also comprise an L-shaped dielectric layer 220, 320 (e.g., an oxide layer) that separates the lower section 215a, 315a of the emitter from the extrinsic base layer 211, 311. The L-shaped dielectric layer 220, 320 can have a vertical portion 220a, 320a and a horizontal portion 220b, 320b. A bottom surface 220c, 320c of the L-shaped dielectric layer 220, 320 can be positioned adjacent the emitter cap layer 218, 318 and an outer end 220d, 320d can be positioned immediately adjacent to the lower section 215a, 315a of the emitter 215, 315. The vertical portion 220a, 320a can extend from the emitter cap layer 218, 318 to the upper section 215b, 315b of the emitter 215, 315. The extrinsic base layer 211, 311 can have a continuous linear edge 201, 301 that extends upwards from the emitter cap layer 218, 318 and is positioned immediately adjacent the vertical portion 220a, 320a of the L-shaped dielectric layer 220, 320. Thus, the edge 201, 301 of the extrinsic base layer 211, 311 is oriented approximately parallel to the lower section 215a, 315a of the emitter 215, 315. So configured, the distance 216, 316 between the edge of the lower section of the emitter and the edge of the extrinsic base is minimized, thereby, reducing the current path between the emitter 215, 315 and the extrinsic base 211, 311. Additionally, the surface area 226, 326 providing electrical contact between the intrinsic 217, 317 and extrinsic 211, 311 base layers is maximized. The transistor 200, 300 can further comprise dielectric spacers 221, 321 (e.g., nitride spacers) above the horizontal portion 220b, 320b of the L-shaped dielectric layer 220, 320 between the vertical portion 220a, 320a and the emitter 215, 315. Thus, these spacers 221, 321 define the shape of the lower section 215a, 315a of the emitter.

The emitter cap layer 218, 318 of the transistor 200, 300 can comprise a crystalline semiconductor material such as crystalline silicon. The intrinsic base layer 217, 317 can also comprise a crystalline semiconductor material (e.g., either a crystalline silicon or crystalline silicon germanium material). The extrinsic base layer 211, 311 can comprise a polycrystalline semiconductor material (e.g., either a polycrystalline silicon material, as illustrated in FIG. 2, or a polycrystalline silicon germanium material, as illustrated in FIG. 3). Referring to FIG. 2, the transistor 200 can further comprise a crystalline silicon germanium layer 270 between the emitter cap layer 218 and the extrinsic base layer 211. This silicon germanium layer 270 can act as an etch stop layer during the transistor 200 fabrication process (e.g., if the extrinsic base layer 211 is a polycrystalline silicon material) and can also be adapted to reduce base resistance (i.e., resistivity between the intrinsic 217 and extrinsic 211 base layers). For example, the crystalline silicon germanium layer 270 can have a predetermined thickness and a predetermined germanium content in order to apply an optimal level of stress to the emitter cap layer 218 and intrinsic base layer. This stress will increase carriers (i.e. electrons or holes) mobility between the base layers 211, 217 and, thereby, enhance conductivity. Similarly, referring to FIG. 3, the content of the germanium in the polycrystalline silicon germanium extrinsic base layer 311 can be predetermined in order to apply an optimal level of stress to the emitter cap layer 318 and the intrinsic base layer and, thereby, enhance conductivity between the intrinsic 317 and extrinsic 311 base layers.

Figure 4:
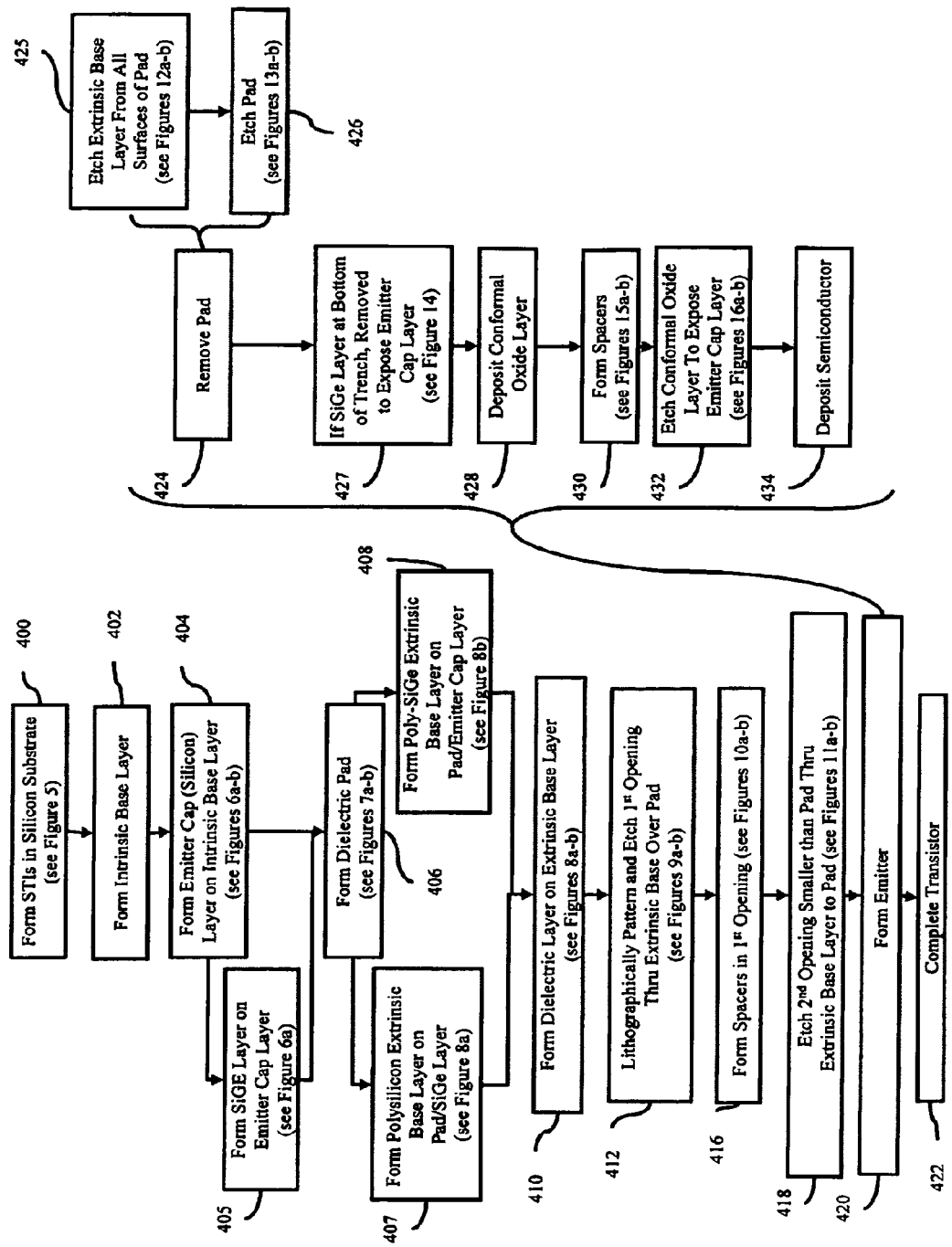
FIG. 4 is a flow diagram illustrating embodiments of a method of the invention.
Figure 5:
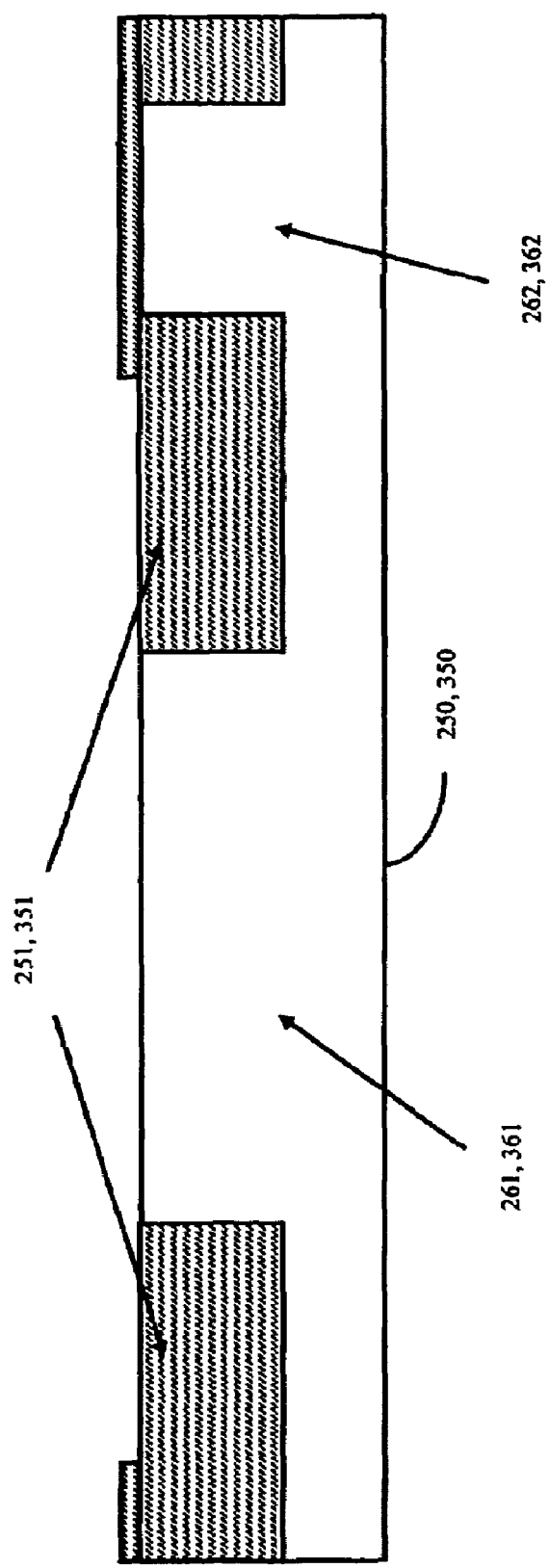
FIG. 5 is a schematic diagram of a partially completed transistor of FIG. 2 or FIG. 3.

Referring to FIG. 4, as mentioned above, the method of fabricating the bipolar transistors 200, 300 with a self-aligned raised extrinsic base 211, 311 uses a simple process flow similar to that of a bipolar transistor with non-self aligned raised extrinsic base as illustrated in FIG. 1. Generally, the method begins with a substrate that is formed by first forming shallow trench isolation structures 251, 351 in a crystalline semiconductor layer 250, 350 (e.g., crystalline silicon) of a wafer to define a collector region 261, 361 and a collector reach-through region 262, 362 in the crystalline semiconductor layer 250, 350 (400, see FIG. 5). Then, an intrinsic base layer 217, 317 can be formed (e.g., by growing either a crystalline silicon or crystalline silicon germanium material) on the collector region 261, 361 of crystalline semiconductor layer 250, 350 (402, see FIGS. 6a-b). An emitter cap layer 218, 318 (e.g., another crystalline silicon layer) can be formed on the intrinsic base layer 217, 317 (404, see FIGS. 6a-b). The emitter cap layer 218, 318 can be formed with a sufficient level of dopant material to facilitate greater selectivity during later etching processes (e.g. see processes 424-427 described below).

In one embodiment of the method used to form the transistor structure 200 of FIG. 2, the substrate 600a is formed with an etch stop layer 270 (e.g., crystalline silicon germanium layer) on the emitter cap layer 218 (405, see FIG. 6a). As with the emitter cap layer 218, 318, the etch stop layer 270 can be formed with a sufficient level of dopant material to facilitate greater selectivity during later etching processes (e.g. see processes 424-427 described below). In another embodiment of the method used to form the transistor structure 300 of FIG. 3, the substrate 600b is formed without an etch stop layer (see FIG. 6b). Then, a dielectric etch stop pad 280, 380 is formed on the substrate 600a, 600b (405). For example, dielectric etch stop pad 280 can be formed on the silicon germanium layer 270, as illustrated in FIG. 7a, or dielectric etch stop pad 380 can be formed directly on the emitter cap layer 318, as illustrated in FIG. 7b. In either embodiment the dielectric etch stop pad 280, 380 can be formed by depositing a conformal oxide layer on the substrate 600a, 600b. The oxide layer can then be lithographically patterned and etched with a predetermined first area dimension 281, 381 (e.g., a minimum dimension capable of being produced using current state-of-the-are lithographic patterning). Once the dielectric etch stop pad 280, 380 is formed at process (405), an extrinsic base layer 211, 311 is formed (e.g., deposited) over dielectric etch stop pad 280, 380 and onto the substrate 600a, 600b. Specifically, referring to FIG. 8a, in the embodiment used to form structure 200 of FIG. 2, the extrinsic base layer 211 can be formed by depositing a polycrystalline silicon material on the dielectric etch stop pad 280 and over the crystalline silicon germanium layer 270 (407). The extrinsic base layer 211 may, alternatively, be formed with a polycrystalline silicon germanium material as long as the concentrations of germanium in the extrinsic base layer 211 and the crystalline silicon germanium layer 270 are sufficiently different such that the extrinsic base layer can be selectively etched at process 425 described below. Referring to FIG. 8b, in the embodiment used to form structure 300 of FIG. 3, the extrinsic base layer 311 can be formed by depositing a polycrystalline silicon germanium material on the dielectric etch stop pad 380 and over the emitter cap layer 318 (408). Then, a dielectric layer 213, 313 (e.g., an isolation oxide layer) is formed (e.g., deposited) over the extrinsic base layer 211, 311 (410, see FIGS. 8a-b).

Figure 10A:
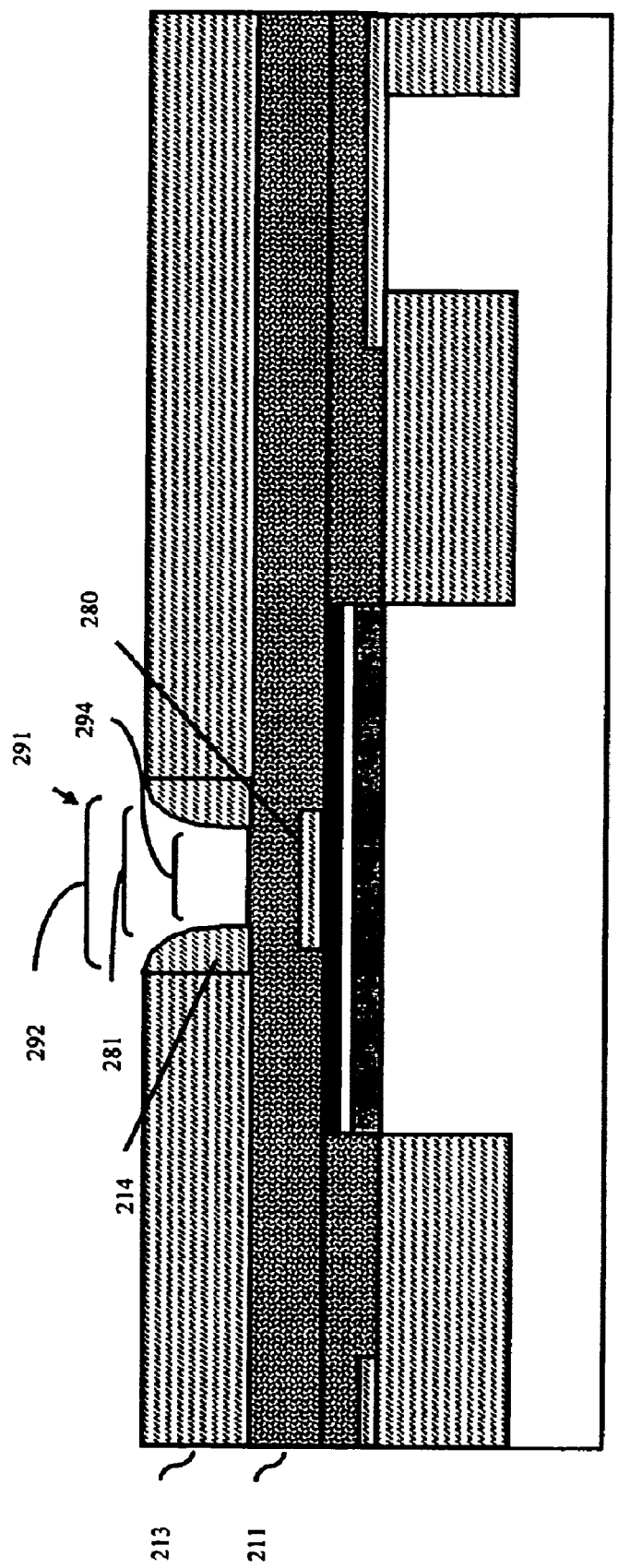
FIGS. 10a-b are schematic diagrams of partially completed transistors of FIGS. 2 and 3, respectively.
Figure 10B:
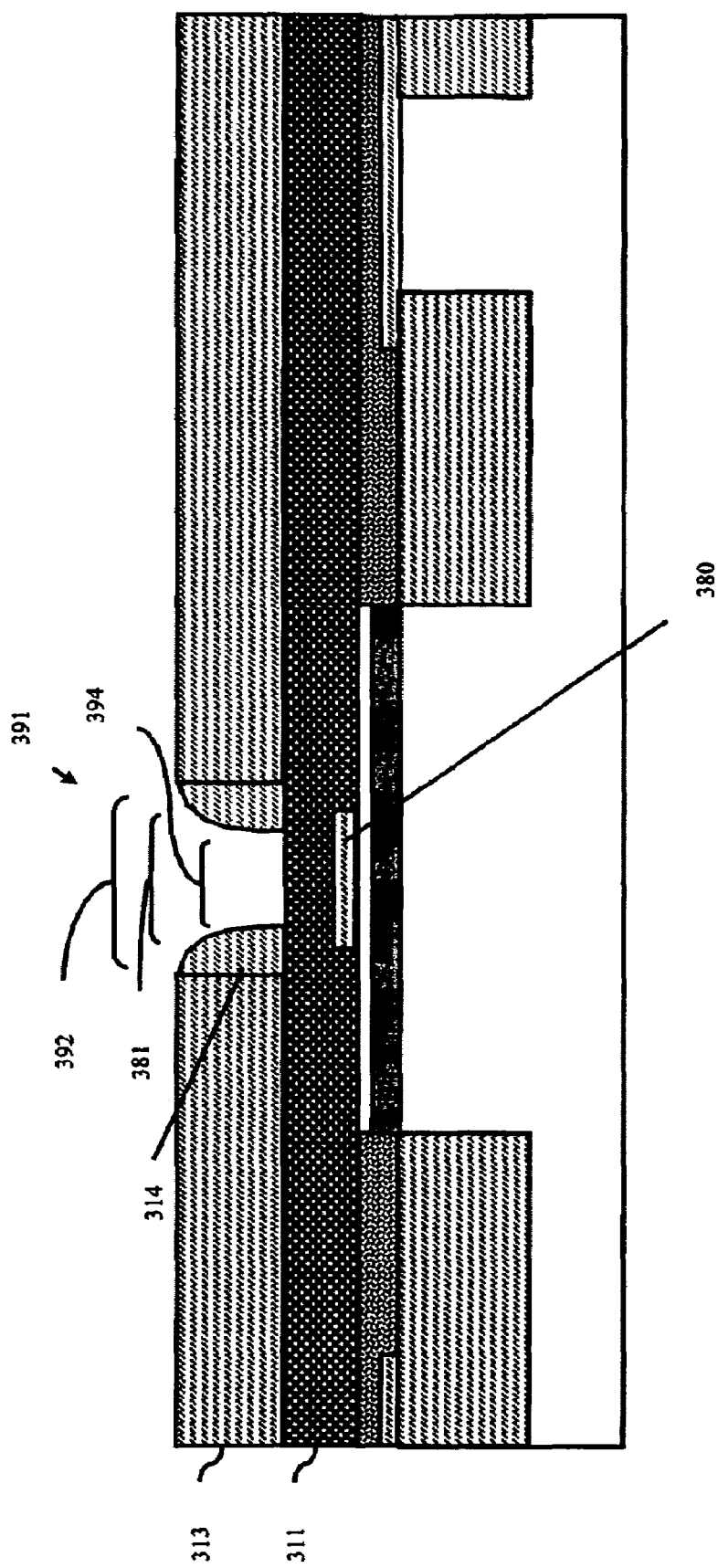
Figure 11A:
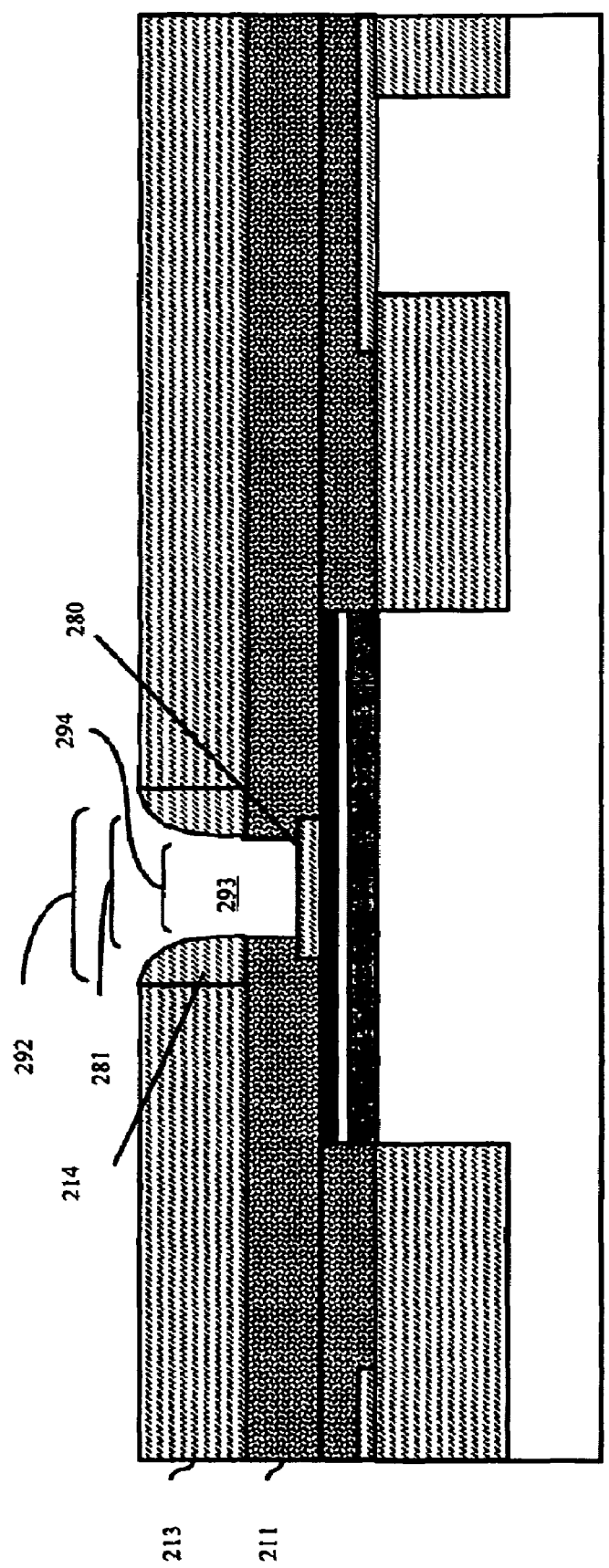
FIGS. 11a-b are schematic diagrams of partially completed transistors of FIGS. 2 and 3, respectively.
Figure 11B:
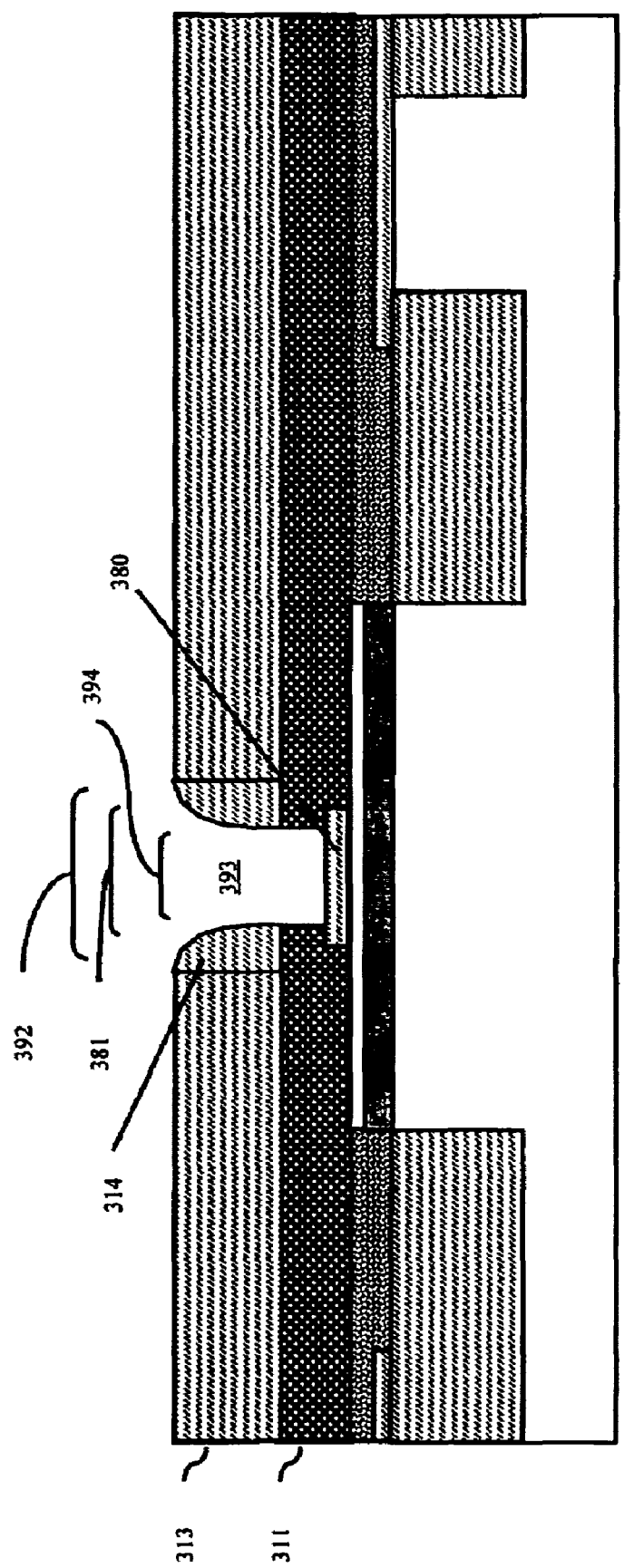

Once the dielectric layer 213, 313 is deposited at process (410), a first opening 291, 391 is lithographically patterned and etched (e.g., by reactive ion etching or some other suitable etching process) through the dielectric layer 213, 313 stopping at the extrinsic base layer 211, 311 (412, see FIGS. 9a-b). The first opening 291, 391 is aligned (i.e., approximately centered) over the dielectric etch stop pad 280, 380 and has a second area dimension 292, 392 that is equal to or greater than the first area dimension 281, 381 (i.e., the first opening 291, 391 is equal to or greater in size than the dielectric etch stop pad 280, 380). Forming the first opening 291, 391 can be accomplished by depositing a photoresist layer and lithographically patterning the photo resist layer with an opening dimension that is comparable to or larger than the dielectric etch stop pad. After the first opening 291, 391 is etched, a second opening 293, 393 is etched through the extrinsic base layer 211, 311 stopping on the dielectric etch stop pad 280, 380 (418). The second opening 293, 393 is aligned (i.e., approximately centered) over the dielectric etch stop pad 280, 380 and has a third area dimension 294, 394 that is less than the first area dimension 281, 381 (i.e., the second opening 293, 393 is smaller in size than the dielectric etch stop pad 280, 380 and does not overlap the edges of the dielectric etch stop pad). Spacers may be used to align the second opening 293, 393 over the dielectric pad 280, 380 and to make sure the second opening has the desired dimension. For example spacers 214, 314 (e.g., oxide or nitride spacers) can be formed in the first opening 291, 391 on the extrinsic base layer 211, 311 adjacent the dielectric layer 213, 313 before the second opening is etched (416, see FIGS. 10a, 10b). The second opening 293, 393 is etched (e.g., by reactive ion etching or some other suitable etching process) guided by the spacers 214, 314 (418, see FIGS. 11a-b) and stops on the dielectric etch stop pad 280, 380. An emitter 215, 315 is then formed in the trench 295, 395 that is created by the first opening and the second opening (420).

Figure 12B:
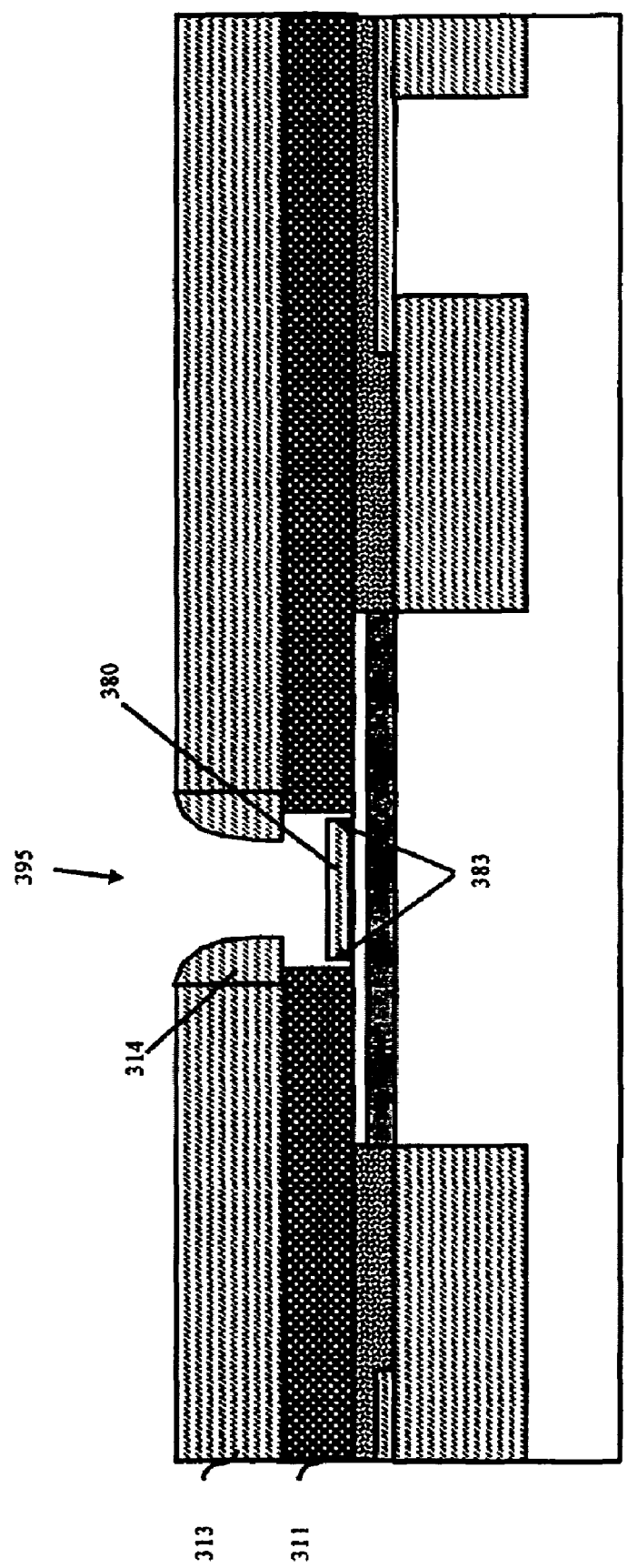

The emitter 215, 315 can be formed by selectively removing the dielectric etch stop pad (424, see FIG. 13b) and, depending upon the embodiment, etching through the crystalline silicon germanium layer (427, see FIG. 14), so that the emitter cap layer 218, 318 is exposed. More particularly, the method employs a multi-step etching process process that allows the dielectric etch stop pad to be selectively removed from the substrate (i.e., selective to either the crystalline silicon germanium layer 270, as illustrated in FIG. 12a, or the crystalline silicon emitter cap layer, as illustrated in FIG. 12b, depending upon the embodiment). Specifically, a first selective etching process (e.g., a wet etch, reactive ion etch, or another suitable etching process) removes the extrinsic base layer 211, 311 from all surfaces 283, 383 of the dielectric etch stop pad 280, 380 (425, see FIGS. 12a-b). Removing the extrinsic base layer 211, 311 from all surfaces 283, 383 of the dielectric etch stop pad 280, 380 then allows the dielectric etch stop pad 280, 380 to be selectively etched and completely removed off the substrate (e.g., by wet etch or other suitable etching process that is selective to the emitter cap layer 318 of FIG. 13b or the silicon germanium layer 270 of FIG. 13a, depending upon the embodiment) (426).

Figure 13A:
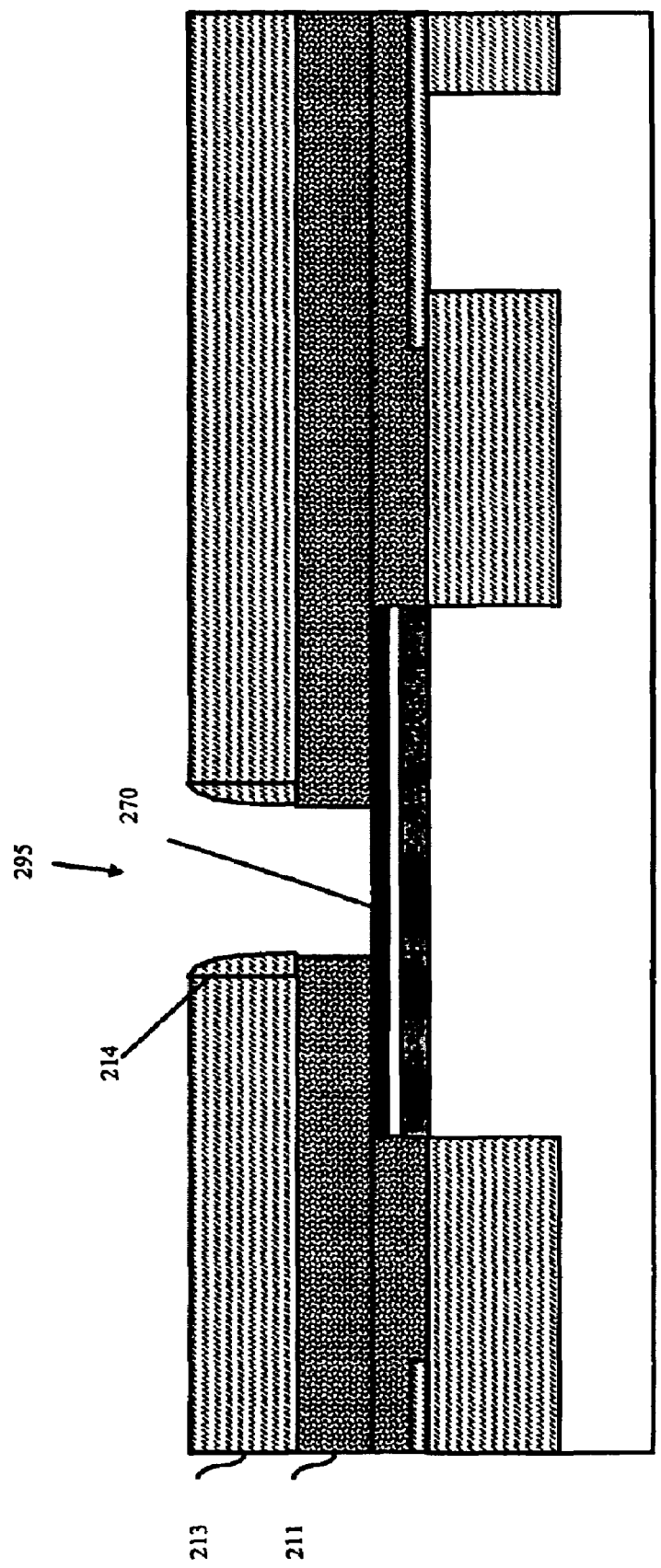
FIGS. 13a-b are schematic diagrams of partially completed transistors of FIGS. 2 and 3, respectively.
Figure 13B:
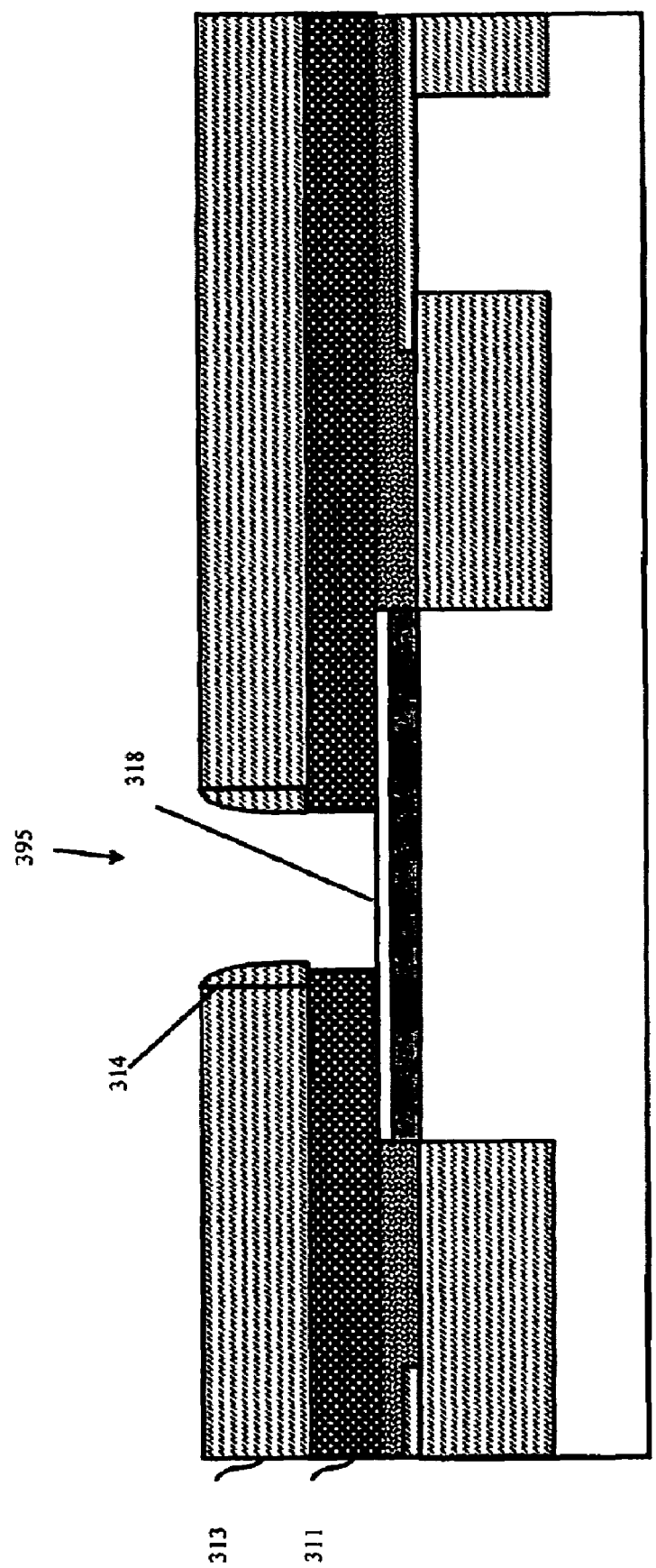
Figure 14:
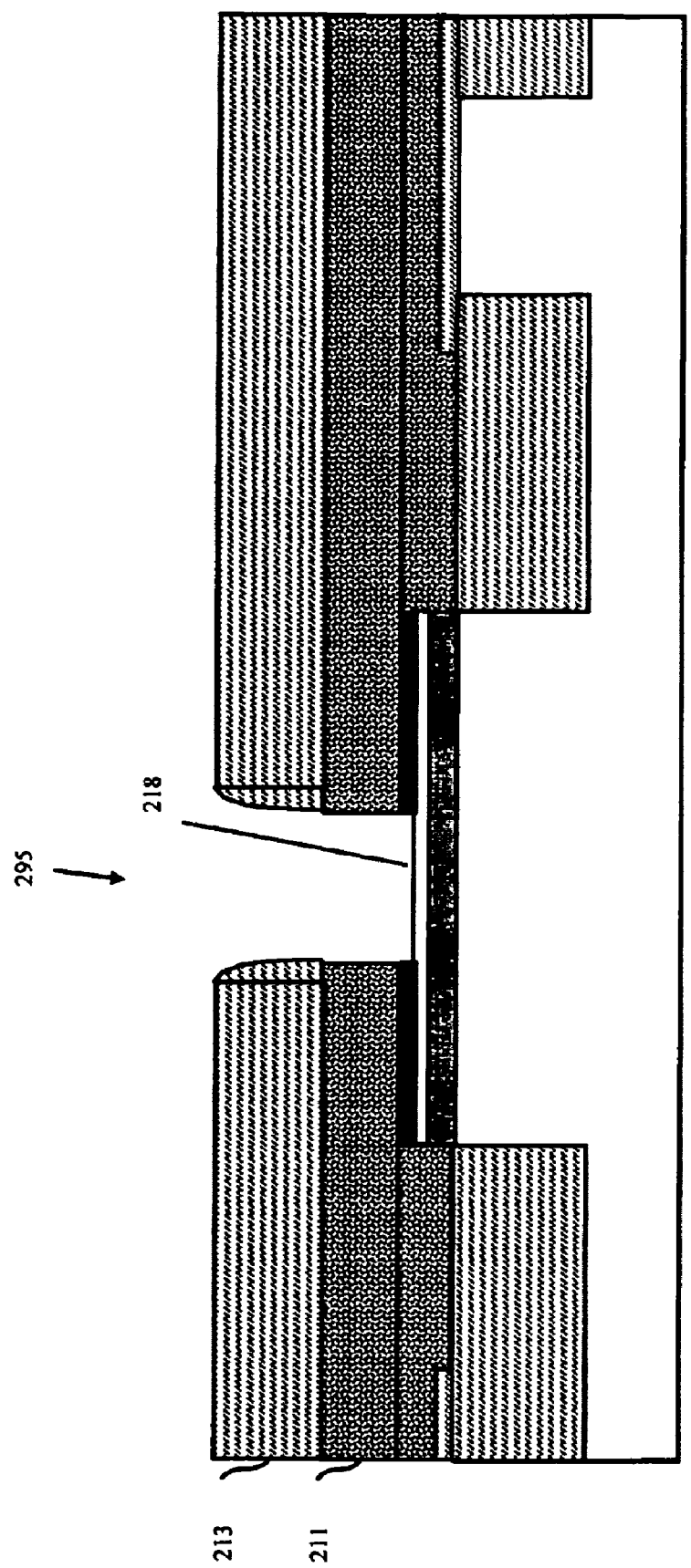
FIG. 14 is schematic diagram of a partially completed transistor of FIG. 2.

For the structure of FIG. 13a, this process is followed by another etching process (e.g., a selective wet etch) to removed the crystalline silicon germanium layer 270 selective to silicon at the bottom of the trench 295 to expose the emitter cap layer 218 (427, see FIG. 14). It should be noted that, if the spacers 214, 314 are oxide spacers, they will be etched back along with the oxide dielectric etch stop pad 280, 380.

Figure 15A:
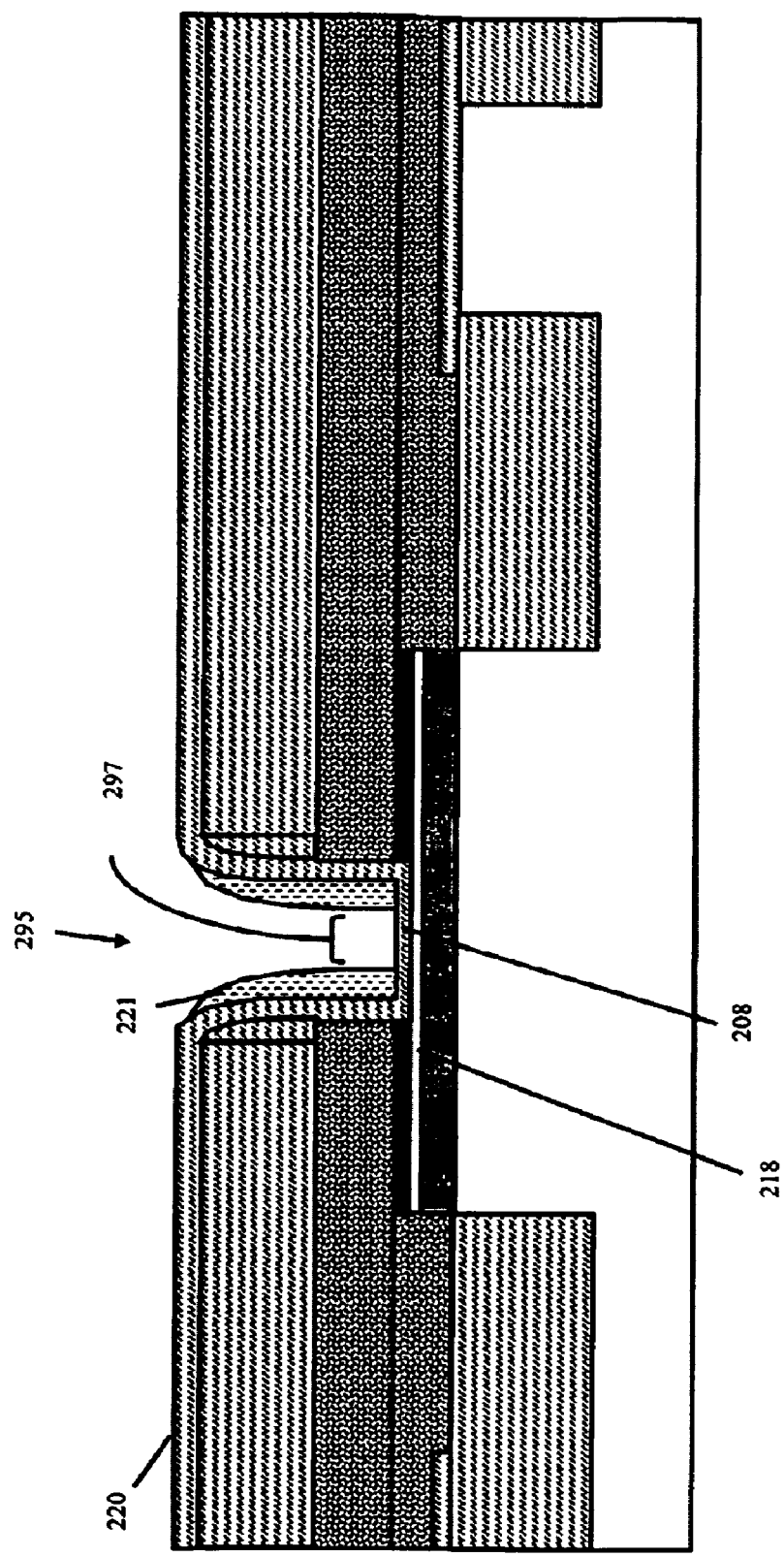
FIGS. 15a-b are schematic diagrams of partially completed transistors of FIGS. 2 and 3, respectively.
Figure 15B:
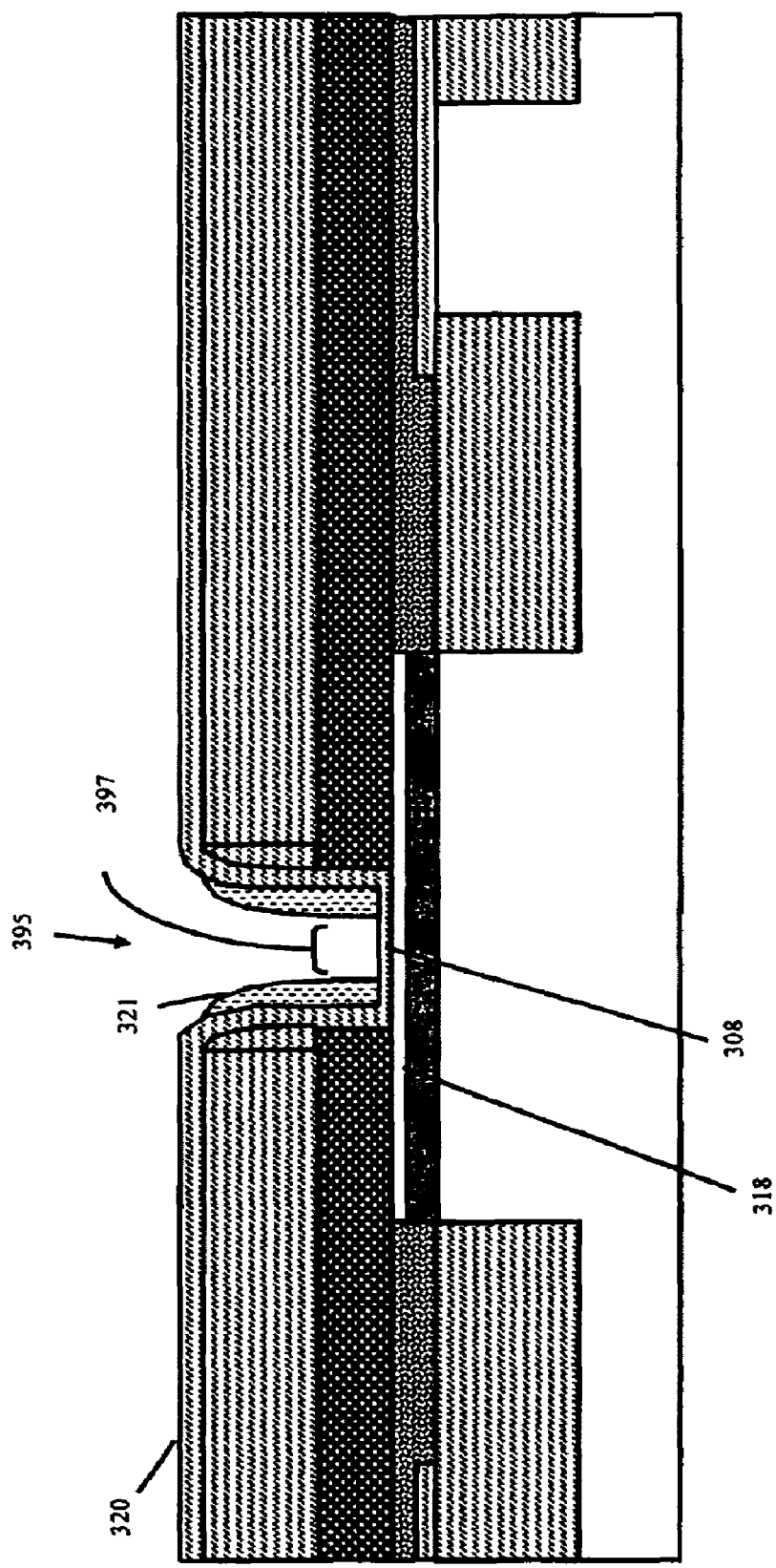
Figure 16A:
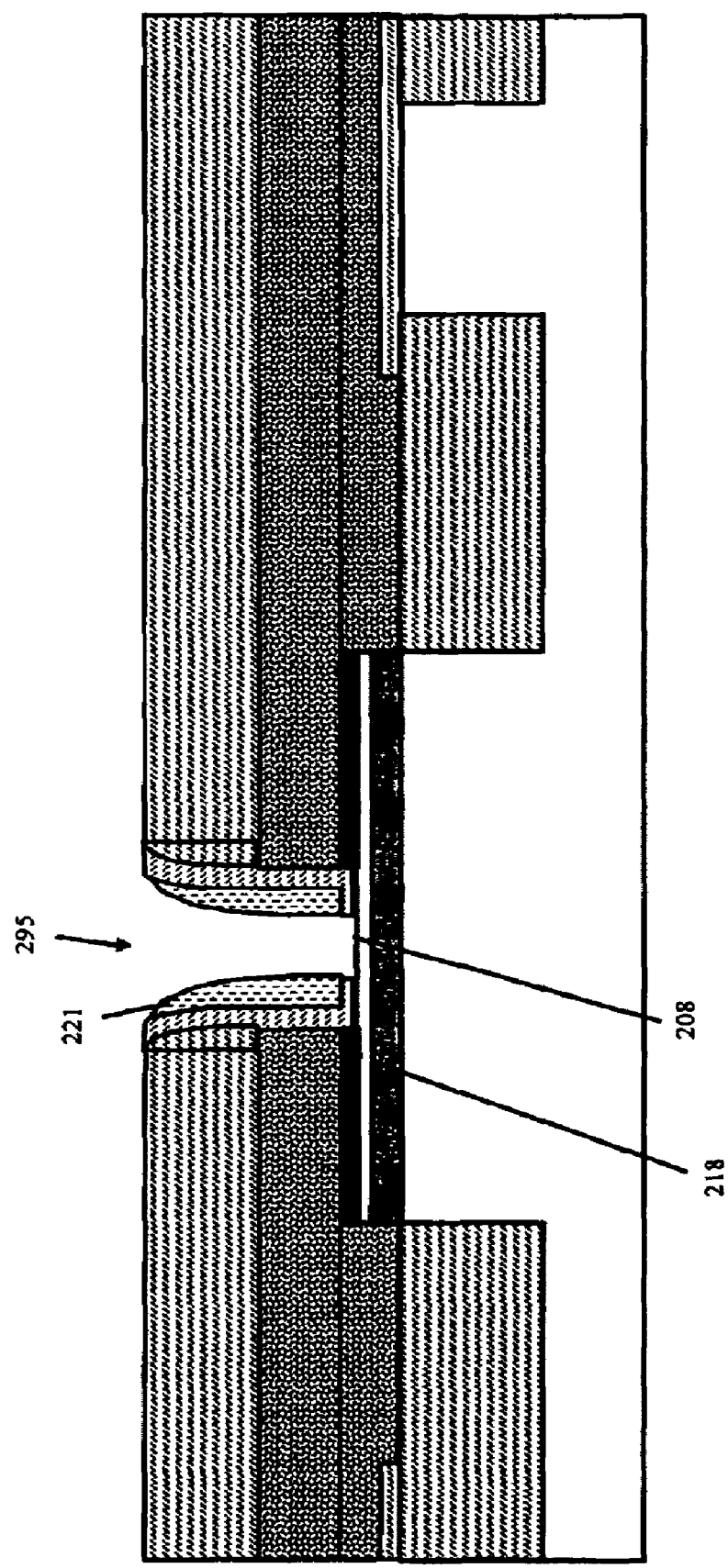
FIGS. 16a and 16b are schematic diagrams of partially completed transistors of FIGS. 2 and 3, respectively.
Figure 16B:
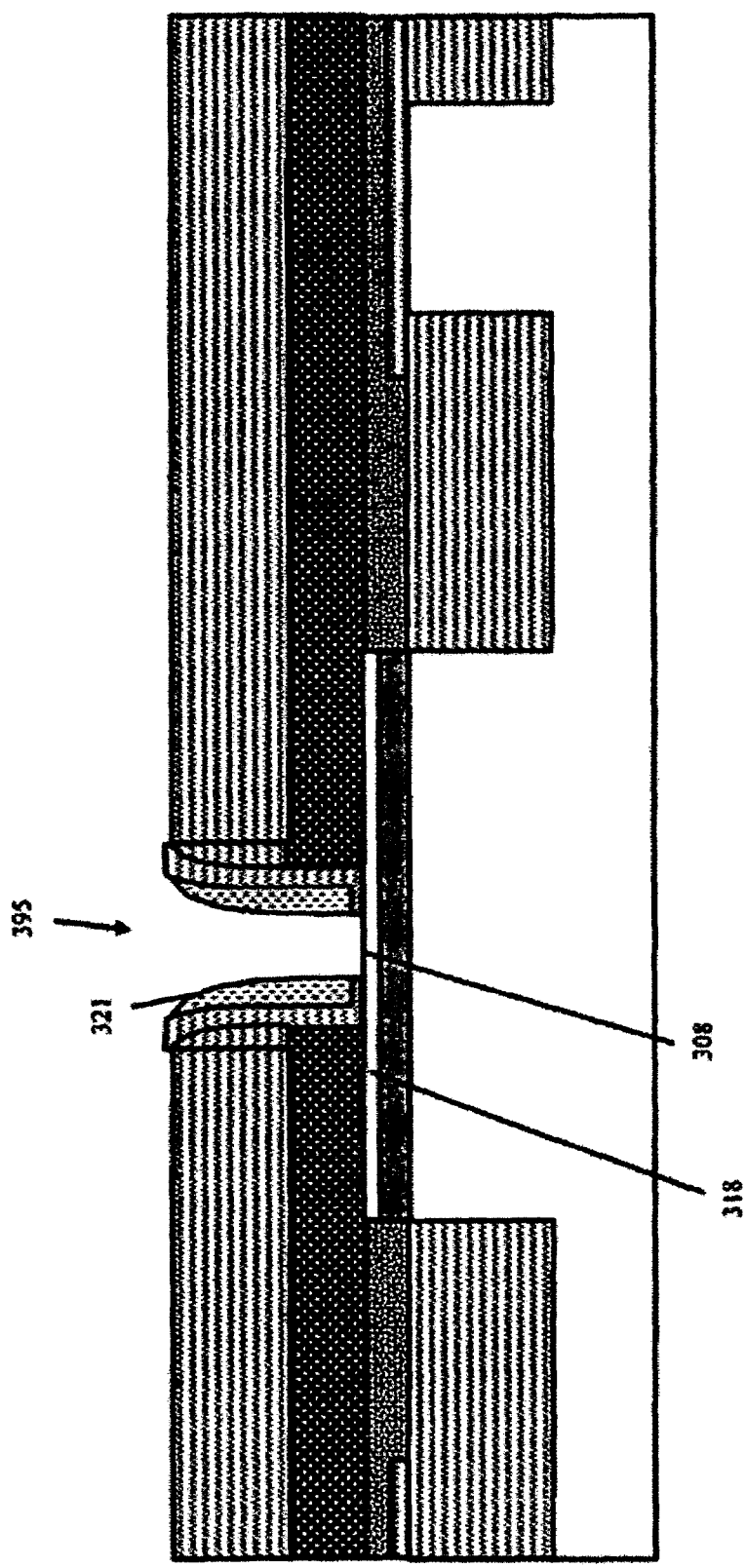

Next a conformal oxide layer 220 (e.g., a thin conformal passivation oxide layer) can be formed (e.g., deposited) on a bottom surface of the trench 295, 395 (i.e., on the emitter cap layer 218, 318 at the bottom of the trench) as well as on sidewalls of the trench and over the dielectric layer 213, 313 (428, see FIGS. 15*a-b*). Dielectric spacers 221, 321 (e.g., nitride spacers) can then be formed on the conformal oxide layer 220, 320 such that a portion 297, 397 of the conformal oxide layer 220, 320 on the bottom surface of the trench 295, 395 remains exposed, thus, defining the shape and size of a lower (vertically oriented) section 215*a*, 315*a* of the emitter (430, see FIGS. 15*a-b*). Once the spacers 221, 321 are formed at process (430), the exposed portion 297, 397 of the conformal oxide layer 220, 320 is etched to expose a portion 208, 308 of the top surface of the emitter cap layer 218, 318 (432, see FIGS. 16*a-b*). This process will simultaneously remove the conformal oxide layer 220, 320 from the top surface of the dielectric layer 213, 313, such that the remaining portion of the conformal oxide layer in the trench forms the L-shaped dielectric layers 220, 320, of structures 200, 300 described in detail above (see FIGS. 2 and 3). A properly doped polycrystalline semiconductor material (e.g., phosphorus or arsenic doped polycrystalline silicon) is deposited into the trench 295, 395 and over the dielectric layer 213, 313, thus, forming the lower (horizontally oriented) section 215*a*, 315*a* of the emitter (434, see FIGS. 2-3). A second dielectric layer (e.g., a nitride layer) can be deposited onto the semiconductor material. Then, the upper (horizontally oriented) section 215*b*, 315*b* of the emitter can be defined by a lithographic patterning and etching process. Once the upper section 215*b*, 315*b* of the emitter is defined, additional fabrication process steps can be performed to complete the transistor (e.g., defining outer limits of the the raised extrinsic base, forming suicides, forming contacts, etc.) (422).

Therefore, disclosed above are embodiments of a fabrication method for a bipolar transistor with a self-aligned raised extrinsic base that uses a simple process flow similar to that of a bipolar transistor with non-self aligned raised extrinsic base and a resulting transistor structure formed according to this method. In each embodiment of the method a dielectric etch stop pad is formed on a substrate and an extrinsic base layer is formed over the dielectric pad and over the substrate. An opening equal to or greater in size than the dielectric pad is patterned and is etched to the extrinsic base layer such that the opening is positioned above the dielectric pad. Another smaller opening is etched through the extrinsic base layer stopping on the dielectric pad. The method then employs a multi-step etching process that selectively removes the extrinsic base layer from the surfaces of the dielectric pad so that the dielectric pad can be selectively removed from the substrate. An emitter is then formed in the resulting trench. The resulting transistor structure has a distance between the edge of the lower section of the emitter and the edge of the extrinsic base that is minimized, thereby, reducing resistance between the emitter and the extrinsic base. Additionally, the surface area providing electrical contact between the intrinsic and extrinsic base layers is maximized and may include a crystalline silicon germanium layer in order to further reduce base resistance. While the invention has been described in terms of preferred embodiments, those skilled in the art will recognize that the invention can be practiced with modification within the spirit and scope of the appended claims.

What is claimed is:

1. A method of forming a bipolar transistor, said method comprising:
    forming a dielectric pad, having a first area dimension, on a substrate;
    forming an extrinsic base layer over said dielectric pad and over said substrate;
    forming a dielectric layer over said extrinsic base layer;
    etching a first opening through said dielectric layer to said extrinsic base layer, wherein said first opening is aligned over said dielectric pad and has a second area dimension that is one of approximately equal to or greater than said first area dimension;
    etching a second opening through said extrinsic base layer to said dielectric pad, wherein said second opening is aligned over said dielectric pad and has a third area dimension that is less than said first area dimension; and
    selectively removing said extrinsic base layer from all surfaces of said dielectric pad.

2. The method of claim 1, wherein said forming of said dielectric pad comprises lithographically patterning said dielectric pad such that said first area dimension is a predetermined dimension.

3. The method of claim 1, further comprising before said etching of said second opening, forming spacers in said first opening on said extrinsic base layer adjacent said dielectric layer to reduce said second area dimension of said first opening.

4. The method of claim 1, further comprising selectively etching and completely removing said dielectric pad off of said substrate.

5. The method of claim 1, further comprising forming an emitter in a trench formed by said first opening and said second opening.

6. The method of claim 5, wherein said forming of said emitter further comprises:
    forming a conformal dielectric layer on a bottom surface and sidewalls of said trench;
    forming spacers on said conformal dielectric layer such that a portion of said conformal dielectric layer on said bottom surface of said trench remains exposed;
    etching said exposed portion of said conformal dielectric layer to said substrate; and
    depositing a polycrystalline semiconductor material into said trench onto said substrate.

7. The method of claim 1, wherein said selectively removing said extrinsic base layer from all surfaces of said dielectric pad comprises performing one of a wet etching process and a reactive ion etching process.

8. A method of forming a transistor, said method comprising:
    forming a crystalline silicon germanium layer;
    forming a dielectric pad, having a first area dimension, on said crystalline silicon germanium layer;
    forming a polycrystalline extrinsic base layer over said dielectric pad and over said crystalline silicon germanium layer;
    forming a dielectric layer over said extrinsic base layer;
    etching a first opening through said dielectric layer to said extrinsic base layer, wherein said first opening is aligned over said dielectric pad and has a second area dimension that is one of approximately equal to or greater than said first area dimension;
    etching a second opening through said extrinsic base layer to said dielectric pad, wherein said second opening is aligned over said dielectric pad and has a third area dimension that is less than said first area dimension; and selectively removing said polycrystalline extrinsic base layer from all surfaces of said dielectric pad.

9. The method of claim 8, further comprising before said forming of said crystalline silicon germanium layer:
    forming an intrinsic base layer with a crystalline semiconductor material; and
    forming an emitter cap layer on said intrinsic base layer, wherein said crystalline silicon germanium layer is formed on said emitter cap layer.

10. The method of claim 9, wherein said crystalline silicon germanium layer is formed with a predetermined thickness and a predetermined germanium content in order to apply stress to said emitter cap layer and, thereby, enhance carrier mobility and conductivity between said intrinsic base layer and said extrinsic base layer.

11. The method of claim 8, wherein said forming of said dielectric pad comprises lithographically patterning said dielectric pad such that said first area dimension is a predetermined dimension.

12. The method of claim 8, further comprising before said etching of said second opening, forming spacers in said first opening on said extrinsic base layer adjacent said dielectric layer so that said second opening is etched with said third area dimension.

13. The method of claim 8, further comprising selectively etching said dielectric pad off of said crystalline silicon germanium layer; and
    etching said crystalline silicon germanium layer from within said second opening selective to said crystalline silicon emitter cap layer to expose said crystalline silicon emitter cap layer.

14. The method of claim 8, further comprising forming an emitter in a trench formed by said first opening and said second opening.

15. The method of claim 14, wherein said forming of said emitter further comprises:
    forming a conformal dielectric layer on a bottom surface and sidewalls of said trench;
    forming dielectric spacers on said conformal dielectric layer such that a portion of said conformal dielectric layer on said bottom surface of said trench remains exposed;
    etching said exposed portion of said conformal dielectric layer to said emitter cap layer; and
    depositing a polycrystalline semiconductor material into said trench onto said emitter cap layer.

16. The method of claim 8, wherein said selectively removing said polycrystalline extrinsic base layer from all surfaces of said dielectric pad comprises performing one of a wet etching process and a reactive ion etching process.

17. A method of forming a transistor, said method comprising:
    forming an emitter cap layer;
    forming a dielectric pad having a first area dimension on said emitter cap layer;
    forming an extrinsic base layer over said dielectric pad;
    forming a dielectric layer over said extrinsic base layer;
    etching a first opening through said dielectric layer to said extrinsic base layer, wherein said first opening is aligned over said dielectric pad and has a second area dimension that is one of approximately equal to or greater than said first area dimension;
    etching a second opening through said extrinsic base layer to said dielectric pad, wherein said second opening is aligned over said dielectric pad and has a third area dimension that is less than said first area dimension; and
    selectively removing said extrinsic base layer from all surfaces of said dielectric pad.

18. The method of claim 17, further comprising before said forming of said emitter cap layer,
    forming an intrinsic base layer with a crystalline semiconductor material, wherein said emitter cap layer is formed on said intrinsic base layer.

19. The method of claim 18, wherein said emitter cap layer comprises a crystalline silicon material, wherein said extrinsic base layer if formed with a polycrystalline silicon germanium material with a predetermined germanium content in order to apply stress to said emitter cap layer and, thereby, enhance carrier mobility and conductivity between said intrinsic base layer and said extrinsic base layer.

20. The method of claim 17, wherein said forming of said dielectric pad comprises lithographically patterning said dielectric pad such that said first area dimension is a predetermined dimension.

21. The method of claim 17, further comprising before said etching of said second opening, forming spacers in said first opening on said extrinsic base layer adjacent said dielectric layer so that said second opening is etched with said third area dimension.

22. The method of claim 17, further comprising selectively etching and completely removing said dielectric pad off of said emitter cap layer.

23. The method of claim 17, further comprising forming an emitter in a trench formed by said first opening and said second opening.

24. The method of claim 23, wherein said forming of said emitter comprises:
    forming a conformal dielectric layer on a bottom surface and sidewalls of said trench;
    forming dielectric spacers on said conformal dielectric layer such that a portion of said conformal dielectric layer on said bottom surface of said trench remains exposed;
    etching said exposed portion of said conformal dielectric layer to said emitter cap layer; and
    depositing a polycrystalline semiconductor material into said trench onto said emitter cap layer.

* * * * *

UNITED STATES PATENT AND TRADEMARK OFFICE
CERTIFICATE OF CORRECTION

PATENT NO. : 7,341,920 B2 Page 1 of 1
APPLICATION NO. : 11/160706
DATED : March 11, 2008
INVENTOR(S) : Marwan H. Khater It is certified that error appears in the above-identified patent and that said Letters Patent is hereby corrected as shown below:

Column 1, line 4, Prior to the background of the invention,
please insert:
Notice of Government rights
--This invention was made with Government support under N66001-02-C-8014 awarded by DARPA. The Government has certain rights in this invention.--

Signed and Sealed this

Twenty-third Day of March, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,341,920 B2 | |
| APPLICATION NO. | : 11/160706 | |
| DATED | : March 11, 2008 | |
| INVENTOR(S) | : Marwan H. Khater | |

It is certified that error appears in the above-identified patent and that said Letters Patent is hereby corrected as shown below:

In the Specifications

Column 1, line 4, Prior to the background of the invention,
please insert:
--This invention was made with Government support under N6601-02-C-8014 awarded by DARPA. The Government has certain rights in this invention.--

This certificate supersedes the Certificate of Correction issued March 23, 2010.

Signed and Sealed this
Ninth Day of April, 2013

Teresa Stanek Rea
*Acting Director of the United States Patent and Trademark Office*